(12) United States Patent
Saito

(10) Patent No.: US 10,194,559 B2
(45) Date of Patent: Jan. 29, 2019

(54) ELECTRONIC APPARATUS AND COOLING SYSTEM FOR ELECTRONIC APPARATUS

(71) Applicant: ExaScaler Inc., Tokyo (JP)

(72) Inventor: Motoaki Saito, Tokyo (JP)

(73) Assignee: EXASCALER INC., Tokyo (JP)

( * ) Notice: Subject to any disclaimer, the term of this patent is extended or adjusted under 35 U.S.C. 154(b) by 13 days.

(21) Appl. No.: 15/545,651

(22) PCT Filed: Jan. 22, 2015

(86) PCT No.: PCT/JP2015/051740
§ 371 (c)(1),
(2) Date: Jul. 21, 2017

(87) PCT Pub. No.: WO2016/117098
PCT Pub. Date: Jul. 28, 2016

(65) Prior Publication Data
US 2018/0020571 A1    Jan. 18, 2018

(51) Int. Cl.
*H05K 7/20* (2006.01)
*H01L 23/473* (2006.01)
(Continued)

(52) U.S. Cl.
CPC .......... *H05K 7/20236* (2013.01); *G06F 1/20* (2013.01); *G06F 1/206* (2013.01); *H01L 23/44* (2013.01);
(Continued)

(58) Field of Classification Search
CPC ....... H05K 7/20236; H05K 7/20627–7/20645; H05K 7/20763–7/20781; H05K 23/473
See application file for complete search history.

(56) References Cited

U.S. PATENT DOCUMENTS 7,623,347 B2 * 11/2009 Matsui .................. H05K 1/189
  361/695
9,756,766 B2 *  9/2017 Best .................. H05K 7/20763
(Continued)

FOREIGN PATENT DOCUMENTS

JP     04207098 A  *  7/1992
JP     2012-527109   11/2012
JP     2013-187251    9/2013

OTHER PUBLICATIONS

Japanese Patent Office Decision to Grant for corresponding Japanese Patent Application No. 2016-507717, received on May 28, 2017, 6 pages. English translation provided.
(Continued)

*Primary Examiner* — Robert J Hoffberg
(74) *Attorney, Agent, or Firm* — Procopio, Cory, Hargreaves & Savitch LLP

(57) ABSTRACT

In a cooling system for electronic apparatuses, the electronic apparatus includes inner partitioning walls disposed in a cooling tank with an open space, defined by a bottom wall and side walls for dividing the open space into arrayed storage sections. An electronic apparatus is stored in the storage section. Inflow openings for the cooling liquid are formed in a bottom portion or a side surface of the respective storage sections, and outflow openings are formed at a position near the liquid surface of the cooling liquid flowing in the respective storage sections. The electronic apparatus includes a first board having a first surface on which at least one processor is mounted, and a second surface opposite the first surface, a second board having the third surface that faces the second surface of the first board, and a flow channel formed as a gap between the second and third surface.

20 Claims, 19 Drawing Sheets

(51) Int. Cl.
    *G06F 1/20*     (2006.01)
    *H01L 23/44*     (2006.01)
    *H05K 5/00*     (2006.01)
    *F25D 9/00*     (2006.01)

(52) U.S. Cl.
    CPC ......... *H01L 23/473* (2013.01); *H05K 5/0026* (2013.01); *H05K 7/20* (2013.01); *H05K 7/20272* (2013.01); *H05K 7/20281* (2013.01); *H05K 7/20636* (2013.01); *F25D 9/005* (2013.01)

(56) References Cited

U.S. PATENT DOCUMENTS

2016/0234970 A1*   8/2016   Shelnutt ............. H05K 7/20809
2017/0354061 A1*  12/2017   Saito ........................ F25D 9/00
2018/0246550 A1*   8/2018   Inaba ..................... G06F 1/206

OTHER PUBLICATIONS

International Preliminary Report on Patentability for PCT/JP2015/051740 dated Aug. 3, 2017, 8 pages. English translation provided.

* cited by examiner

ELECTRONIC APPARATUS AND COOLING SYSTEM FOR ELECTRONIC APPARATUS

CROSS-REFERENCE TO RELATED APPLICATIONS

This application is a U.S. National Stage entry of PCT Application No. PCT/JP2015/051740, filed on Jan. 22, 2015, the contents of which are incorporated herein by reference.

TECHNICAL FIELD

The present invention relates to an electronic apparatus, and a cooling system for the electronic apparatus, and more particularly, to the electronic apparatus immersed in cooling liquid filled in the cooling system so as to be directly cooled, and the cooling system for the electronic apparatus. In the present description, the electronic apparatus refers to the one that requires super-high performance operations and stable operations, and that has large amounts of heat generated itself, such as a supercomputer, a data center or the like but it is not limited thereto.

BACKGROUND ART

One of the biggest problems that determine the limitation in performance of supercomputers in recent years is power consumption, and the importance of researches relating to the power-saving capability of supercomputers has already been recognized widely. That is, the speed performance per consumed power (Flops/W) has become one barometer for evaluating the supercomputers. Further, in data centers, it is understood that 45% or so of the power consumption by the whole data centers are consumed for cooling, and therefore, a demand for reduction of the power consumption through improvements in cooling efficiency has become strong.

Heretofore, an air-cooling type and a liquid-cooling type have been in use for cooling supercomputers and data centers. The liquid-cooling type is generally recognized to be high in cooling efficiency because of using a liquid that is remarkably superior to air in heat transfer performance. For example, the "TSUBAME-KFC" built by Tokyo Institute of Technology achieved 4.50 G Flops/W by a liquid immersion cooling system using a synthetic oil and acquired the first place in "Supercomputer Green 500 List" announced on November, 2013 and June, 2014. However, because the synthetic oil being high in viscosity is used as the cooling liquid, it is difficult to completely remove, from electronic apparatuses taken out from oil-immersed racks, the oil adhered thereto, and this gives rise to a problem that the maintenance (specifically, adjustment, inspection, repair, replacement and expansion, for example; the same applies hereafter) of the electronic apparatuses is extremely difficult. Furthermore, the occurrence of a problem has been reported that causes a difficulty to arise in practical use because, for example, the synthetic oil in use leaks by corroding a gasket and the like constituting the cooling system in a short period of time.

On the other hand, there has been proposed a liquid immersion cooling system that uses not the synthetic oil causing the aforementioned problems but a cooling liquid of the fluorocarbon-base. Specifically, it is an example that uses a cooling liquid of the fluorocarbon-base (a hydrofluoroether (HFE) compound known as "Novec (trademark of 3M Company; the same applies hereafter) 7100", "Novec 7200" and "Novec 7300", brand names of 3M Company) (Patent Literature 1 and Patent Literature 2, for example).

CITATION LIST

Patent Literature

PTL 1: Japanese Unexamined Patent Application Publication No. 2013-187251
PTL 2: Japanese Unexamined Patent Application Publication (Translation of PCT Application) No. 2012-527109

SUMMARY OF INVENTION

Technical Problem

In the cooling system disclosed in Patent Literature 1, a plurality of containers storing servers are stored in racks installed in the data center, a plurality of servers are stored in each of the containers, and there is connected a refrigerant flow mechanism that constitutes the flow of liquid refrigerant from an inlet to an outlet in each container. Thus, within one container, the temperature of the liquid refrigerant becomes high as the same is close to the outlet apart relative to the inlet, and further, because the electronic apparatuses stored within a container of a large volume in a high density impede the flow of the liquid refrigerant, warmed liquid refrigerant is apt to stay at around the center of the container. This generates an uneven temperature distribution within the container and hence, gives rise to a problem that in dependence on the storage positions of servers, a large difference in cooling performances arises between the server themselves or between important semiconductor parts and electronic components within each server.

On the other hand, the cooling system disclosed in Patent Literature 2 takes the configuration of a sealed module containing one or more heating electronic apparatuses. Thus, because a mechanism for making cooling fluid flow to pass through individual sealed modules becomes complicated as a whole and because it is unable to take out the whole of electronic apparatuses easily from the sealed module, there arises a problem in that the maintainability of the electronic apparatuses are inferior.

In electronic apparatuses used in recent supercomputers, data centers and the like, a plurality of objects to be cooled such as a GPU (Graphics Processing Unit), a high speed memory, a chip set, a network unit, a bus switching unit, an SSD (Solid State Drive), an ac-dc converter, a dc-dc voltage converter and the like are included in addition to a CPU (Central Processing Unit), and it is often the case that any one or a plurality of these electronic components or a combination of these electronic components are mounted on one or several boards (for example, mounting in combination one mother board and a plurality of general-purpose boards with a CPU mounted). Thus, where servers of the size for 19 inch-racks which are conventional in data centers and the like are stored in a liquid immersion rack and are subjected to liquid immersion cooling, a hoist crane or the like is used in order to insert into or take out from a liquid immersed rack a massive and heavy server having a dimension of the degree being 70 to 90 centimeters high and 45 centimeter wide. Accordingly, in liquid immersion cooling systems in the prior art, there arises a problem that an inconvenience occurs in handling the electronic apparatus being large in size and being heavy and that much effort is required for the setting and maintenance therefor.

As the board of the electronic apparatus has the CPU and other electronic parts densely packed, the board with multi-layer wiring is generally employed. As densification proceeds, the number of layers of the multi-layer wiring has to be increased. This will make the board thick, which is unlikely to transfer heat from one surface to the other opposite surface of the board. The problem is that this may make cooling the electronic apparatus where the cooling liquid takes heat from both surfaces of the board less efficient.

As aforementioned, the liquid immersion cooling system in the prior art involves a problem that the temperature distribution is generated with the cooling liquid in a cooling tank, thereby causing large differences to arise in cooling performances of the electronic apparatuses in dependence on the storage locations of the electronic apparatuses. Further, another problem arises in that the mechanism for making the cooling liquid flow through the sealed module becomes complicated as a whole, thereby being inferior in the maintainability of the electronic apparatuses. In addition, a further problem arises in that inconvenience occurs in handling the electronic apparatuses being larger in size and being heavy and hence that much effort is required for the installation and maintenance of the electronic apparatuses. Further another problem arises in that cooling the electronic apparatus where cooling liquid takes heat from both surfaces of the board may be less efficient.

Accordingly, an object of the present invention is to provide a cooling system capable of solving the problems of the foregoing prior art, of improving the cooling performances of a plurality of electronic apparatuses and of being stabilized through the elimination of variance in cooling performance. Further, another object of the present invention is to provide a cooling system being improved in handling capability and maintainability of a plurality of electronic apparatuses in immersion cooling. A still further object of the present invention is to provide an electronic apparatus being improved in cooling efficiency in immersion cooling.

Solution to Problem

For solving the above-described problem, according to an aspect of the present invention, there is provided an electronic apparatus which is directly cooled through immersion in a cooling liquid filled in a cooling system. The electronic apparatus is stored in each of a plurality of arrayed storage sections of the cooling system. The cooling system includes a cooling tank having an open space defined by a bottom wall and side walls, the plurality of arrayed storage sections defined by dividing the open space with a plurality of inner partitioning walls within the cooling tank, and an inflow opening and an outflow opening for the cooling liquid that are formed at each of the plurality of arrayed storage sections. The inflow opening is formed in a bottom portion or a side surface of the storage sections, and the outflow opening is formed in the vicinity of the liquid level of the cooling liquid which circulates through the respective storage sections. The electronic apparatus includes a first board having a first surface on which at least one processor is mounted, and a second surface opposite the first surface, a second board having a third surface that faces the second surface of the first board, and a flow channel formed as a gap between the second surface of the first board and the third surface of the second board.

In a preferred embodiment of the electronic apparatus according to the present invention, a plurality of spacers and a plurality of screws for retaining the gap may be provided. Each of the screws may penetrate through the first board, the second board, and the spacers for fixation.

In another preferred embodiment of the electronic apparatus according to the present invention, the first board or the second board may include at least one connector. The connector may be electrically coupled with a power source line or a signal line provided for a pair of board retainers which retain any one or both of the first board and the second board in the respective storage sections.

In another preferred embodiment of the electronic apparatus according to the present invention, the first board may include an electric contact, and the second board may include an electric contact. The electric contact of the first board may be electrically coupled with the electric contact of the second board via a conductive screw. Any one or both of the electric contact of the first board and the electric contact of the second board may be electrically coupled with a power source line or a signal line provided for a pair of board retainers which retain any one or both of the first board and the second board in the respective storage sections.

In another preferred embodiment of the electronic apparatus according to the present invention, a conductive hole through which the conductive screw penetrates may be formed in the spacer.

In another preferred embodiment of the electronic apparatus according to the present invention, the first board may include an electric contact, and the second board may include an electric contact. The electric contact of the first board may be electrically coupled with the electric contact of the second board via a conductive screw and a conductive spacer. Any one or both of the electric contact of the first board and the electric contact of the second board may be electrically coupled with a power source line or a signal line provided for a pair of board retainers which retain any one or both of the first board and the second board in the respective storage sections.

In another preferred embodiment of the electronic apparatus according to the present invention, the first board may include an electric contact, and the second board may include an electric contact. The electric contact of the first board may be electrically coupled with the electric contact of the second board via a conductive hole formed in the spacer, through which the screw penetrates. Any one or both of the electric contact of the first board and the electric contact of the second board may be electrically coupled with a power source line or a signal line provided for a pair of board retainers which retain any one or both of the first board and the second board in the respective storage sections.

In another preferred embodiment of the electronic apparatus according to the present invention, the first board may include an electric contact, and the second board may include an electric contact. The electric contact of the first board may be electrically coupled with the electric contact of the second board via a conductive spacer. Any one or both of the electric contact of the first board and the electric contact of the second board may be electrically coupled with a power source line or a signal line provided for a pair of board retainers which retain any one or both of the first board and the second board in the respective storage sections.

According to another aspect of the present invention, there is provided a cooling system for directly cooling a plurality of electronic apparatuses through immersion into cooling liquid, the cooling system comprising a cooling tank having an open space defined by a bottom wall and side walls, a plurality of arrayed storage sections defined by dividing the open space with a plurality of inner partition walls provided within the cooling tank, an inflow opening and an outflow opening for the cooling liquid that are formed at each of the plurality of storage sections, and a pair of board retainers provided for each storage section. The inflow opening is formed at a bottom portion or a side surface of each storage section and wherein the outflow opening is formed in the vicinity of the liquid level of the cooling liquid flowing through each storage section. The pair of board retainers are configured to retain any one or both of a first board and a second board of the electronic apparatus. The electronic apparatus includes the first board having a first surface on which at least one processor is mounted, and a second surface opposite the first surface, the second board having a third surface which faces the second surface of the first board, and a flow channel formed as a gap between the second surface of the first board and the third surface of the second board.

In a preferred embodiment of the cooling system according to the present invention, the outflow opening and/or the inflow opening may be configured to be formed at a position where the plurality of inner partitioning walls defining each storage section intersect with one another, or in the vicinity of the position.

Further, in another preferred embodiment of the cooling system according to the present invention, an outflow pipe may be further provided piercing through the bottom wall and extending to the vicinity of the liquid level, wherein the outflow opening may be formed at one end of the outflow pipe.

Furthermore, in another preferred embodiment of the cooling system according to the present invention, one or more small holes may be formed in the longitudinal direction of the outflow pipe.

Further, in another preferred embodiment of the cooling system according to the present invention, an inflow pipe may be further provided piercing through the bottom wall and extending to the vicinity of the liquid level, wherein the inflow pipe may be provided with a plurality of nozzles in the longitudinal direction of the inflow pipe and wherein the inflow opening may be formed on each of the plurality of nozzles.

Furthermore, in another preferred embodiment of the cooling system according to the present invention, an inflow pipe and an outflow pipe may be further provided that pierce through the bottom wall and that extend to the vicinity of the liquid level, wherein the inflow pipe may be provided with a plurality of nozzles in the longitudinal direction of the inflow pipe, wherein the inflow opening may be provided on each of the plurality of nozzles, wherein the outflow opening may be formed at an upper end of the outflow pipe, and wherein the inflow pipe and the outflow pipe may be alternately arranged at positions where the plurality of inner partitioning walls defining each storage section intersect with one another, or in the vicinity of the positions.

Further, in another preferred embodiment of the cooling system according to the present invention, an inflow pipe and an output pipe may be further provided that pierce through the bottom wall and that extend to the vicinity of the liquid level, wherein the inflow pipe may be provided with a plurality of nozzles in the longitudinal direction of the inflow pipe, wherein the inflow opening may be formed on each of the plurality of nozzles, wherein the outflow opening may be formed at an upper end of the outflow pipe, and wherein the inflow pipe and the outflow pipe may constitute a double pipe containing the outflow pipe in the inflow pipe.

Furthermore, in another preferred embodiment of the cooling system according to the present invention, the double pipe may be arranged at a position where the plurality of inner partitioning walls defining each storage section intersect with one another, or in the vicinity of the position.

Further, in another preferred embodiment of the cooling system according to the present invention, the cooling liquid may be configured to contain perfluoride as a main component.

Furthermore, in another preferred embodiment of the cooling system according to the present invention, the cooling tank has an inlet for distributing the cooling liquid toward the inflow openings of respective storage sections and an outlet for collecting the cooling liquids passing through the outflow openings of the respective storage sections, wherein the outlet and the inlet may be connected through a flow passage existing outside the cooling tank, and wherein at least one pump for moving the cooling liquid and a heat exchanger for cooling the cooling liquid may be provided in the flow passage.

Further, in another preferred embodiment of the cooling system according to the present invention, there may be further provided with a mechanism which, in response to an input signal depending on the temperature variation in each storage section, regulates the flow rate of the cooling liquid passing through the inflow opening of each storage section or the flow rate of the cooling liquid passing through each nozzle provided on the inflow pipe.

Furthermore, in another preferred embodiment of the cooling system according to the present invention, a first temperature sensor for liquid may be provided within each storage section, and there may be further provided a mechanism which discontinues the operation of the electronic apparatus stored in the storage section or interrupts the power supply to the electronic apparatus when a predetermined temperature or higher is detected by the first temperature sensor.

Further, in another preferred embodiment of the cooling system according to the present invention, a second temperature sensor may be provided in the electronic apparatus stored in each storage section, or in a surrounding area of the electronic apparatus stored in each storage section, and there may be further provided a mechanism which discontinues the operation of the electronic apparatus or interrupts the power supply to the electronic apparatus when a predetermined temperature or higher is detected by the second temperature sensor.

Furthermore, in another preferred embodiment of the cooling system according to the present invention, the pair of board retainers may include a power source line or a signal line electrically coupled with any one or both of the first board and the second board.

Advantageous Effects of Invention

Having been described with respect to the electronic apparatus and the cooling system for the electronic apparatus, the electronic apparatus is configured to be stored in each of a plurality of storage sections of the cooling system. The cooling system includes a plurality of inner partitioning walls in the cooling tank having open space defined by the bottom wall and side walls to divide the open space into a plurality of arranged storage sections. An inflow opening and an outflow opening for the cooling liquid are formed in each of the storage sections. The inflow opening is formed in a bottom portion or a side surface of the storage section. The outflow opening is formed in the vicinity of the liquid level of the cooling liquid which circulates through the respective storage sections. Therefore, an electronic apparatus of the width (for example, about ½, ⅓ or ¼) being smaller than that in the prior art is stored in the storage section of the volume being about ¼ or the volume being smaller than about ¼ of the volume of the open space of the cooling tank (for example, about ⅑ (in the case of the division of 3 in length by 3 in width), 1/12 (in the case of the division of 3 in length by 4 in width), or 1/16 (in the case of the division of 4 in length by 4 in width) of the open space volume), and the cooling liquid is made to flow individually, so that it becomes possible to cool the plurality of electronic apparatuses individually and efficiently. In other words, in the present invention, since the warmed cooling liquid can be made to flow out also from a center portion of the cooling tank, it can be avoided that the cooling liquid stays at around the center of the cooling tank as is the case in the prior art wherein warmed cooling liquid is made to flow out from a side surface of a cooling tank and hence that the difference in cooling performance arises in dependence on storage positions of the electronic apparatuses within the cooling tank. Accordingly, the cooling performances of the plurality of electronic apparatuses can be improved and can be stabilized by being prevented from being varied. Further, since the electronic apparatuses stored in the storage sections can be reduced in dimension, it is possible to improve the handling and maintainability of the electronic apparatuses. Furthermore, the electronic apparatus according to the present invention is configured to allow the processor and other electronic parts to be mounted on a plurality of boards. It is therefore possible to reduce the number of layers of the multi-layer wiring for each board smaller than usual so as to reduce the thickness of the processor board. Then heat from the processor mounted on the processor board is likely to be transferred to the back surface thereof. The heat is quickly and efficiently taken from the back surface of the processor board when part of the cooled cooling liquid circulating through the respective storage sections passes through the flow channel as the gap between the second surface of the first board and the third surface of the second board. The cooling liquid quickly and efficiently takes heat from both surfaces of the processor board so as to improve efficiency for cooling the electronic apparatus. Incidentally, the cooling tank with the "open space" in the present description also encompasses a cooling tank having a simple closed structure of the degree that does not spoil the maintainability of the electronic apparatuses. For example, the structure in which a top board is detachably attached to an opening portion of a cooling tank through a gasket is considered to be the simple closed structure.

The above-described and any other objects and advantages will be clarified through explanation of the following embodiments. The embodiments to be described below are mere examples which will not restrict the present invention.

DESCRIPTION OF EMBODIMENT

Figure 1:
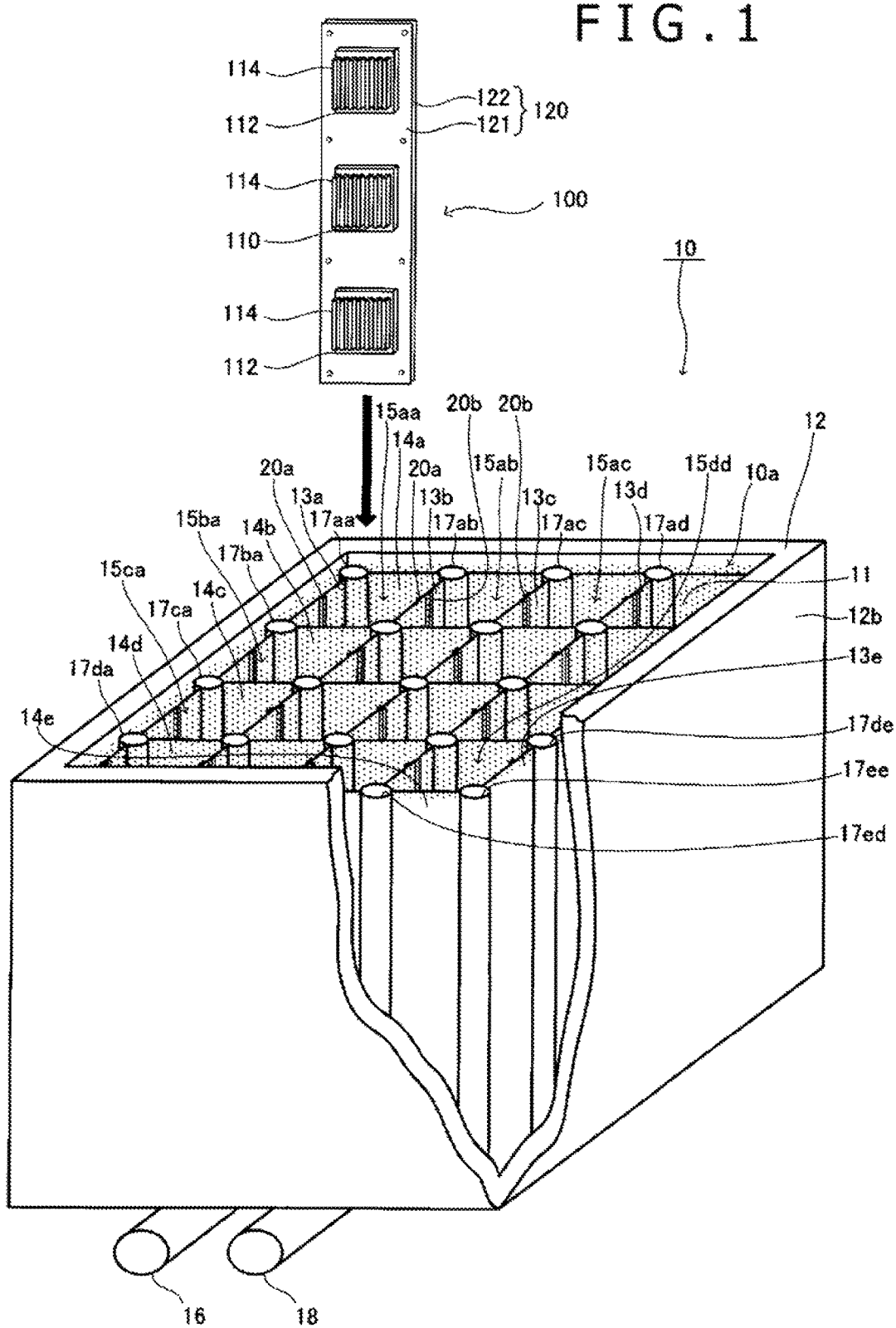
FIG. 1 is a perspective view including a fragmentary section, which represents an overall structure of a cooling system according to an embodiment of the present invention.
Figure 2:
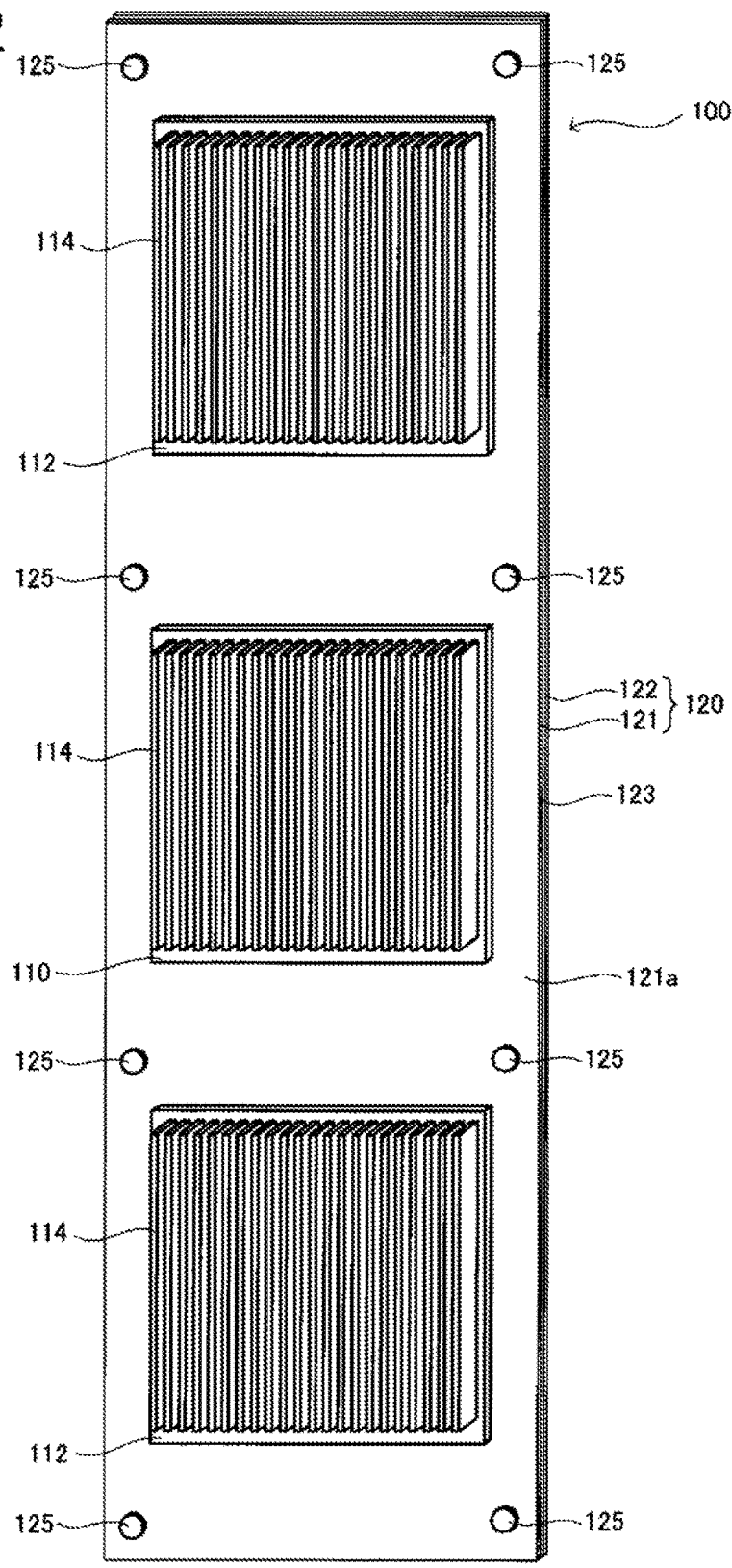
FIG. 2 is a perspective view of an electronic apparatus according to an embodiment of the present invention.

Hereinafter, preferred embodiments of an electronic apparatus and a cooling system for the electronic apparatus according to the present invention will be described in detail with reference to the drawings. In the description of the embodiments, there will be described high-density cooling systems of the configuration that stores 16 units in total as electronic apparatuses in respective storage sections of a cooling tank. Each unit has an electronic apparatus (1 unit) that includes a multi-stage board comprising a processor board on which a plurality of processors constituted by CPU and GPU are mounted, and a board on which other electronic parts are mounted. It is to be understood that the above description is a mere example. The number of the processors or type (CPU or GPU) thereof for each board may be arbitrarily set as well as the number of units of the electronic apparatuses for the high density cooling system, which are not limited thereto. As for the multi-board structure according to the embodiment, the processor board on which a plurality of processors are mounted corresponds to the "first board", and the board on which other electronic parts are mounted corresponds to the "second board" according to the present invention.

Referring to FIGS. 1 to 9, a cooling system 10 according to one embodiment of the present invention has a cooling tank 12, and an open space 10a is defined by a bottom wall 12a and side walls 12b of the cooling tank 12. The open space 10a is divided equally into sixteen by the provision of inner partitioning walls 13a, 13b, 13c, 13d, 13e in a length direction and inner partitioning walls 14a, 14b, 14c, 14d, 14e in a width direction in the cooling tank 12, whereby sixteen arrayed storage sections 15aa, 15ab, 15ac, 15ad, 15ba, 15bb, 15bc, 15bd, 15ca, 15cb, 15cc, 15cd, 15da, 15db, 15dc, 15dd (hereafter, occasionally referred to as "storage sections 15aa to 15dd" collectively) are defined. Then, at least one electronic apparatus 100 is stored in each storage section. Within the open space 10a of the cooling tank 12, cooling liquid 11 is contained to a liquid level 19. The storage sections 15aa, 15ab, 15ac, 15ad, 15ba, 15bb, 15bc, 15bd, 15ca, 15cb, 15cc, 15cd, 15da, 15db, 15dc, 15dd are formed at bottom portions with inflow openings 16aa, 16ab, 16ac, 16ad, 16ba, 16bb, 16bc, 16bd, 16ca, 16cb, 16cc, 16cd, 16da, 16db, 16dc, 16dd (hereafter, occasionally referred to as "inflow openings 16aa to 16dd" collectively), respectively.

Further, in the vicinity of the liquid level 19 of the cooling liquid 11 flowing through the storage sections 15aa to 15dd, there are formed outflow openings 17aa, 17ab, 17ac, 17ad, 17ae, 17ba, 17bb, 17bc, 17bd, 17be, 17ca, 17cb, 17cc, 17cd, 17ce, 17da, 17db, 17dc, 17dd, 17de, 17ea, 17eb, 17ec, 17ed, 17ee (hereafter, occasionally referred to as "outflow openings 17aa to 17ee" collectively).

In the illustrated example, the outflow openings are formed at positions where the plurality of inner partitioning walls defining respective storage sections intersect with one another, or in vicinity of such positions. For example, referring to FIG. 1, the storage section 15aa is defined by the inner partitioning wall 13a, 13b in the length direction and the inner partitioning wall 14a, 14b in the width direction, and the outflow openings 17aa, 17ba, 17ab, 17bb are formed to be located respectively at an intersection point of the inner partitioning wall 13a and the inner partitioning wall 14a, an intersection point of the inner partitioning wall 13a and the inner partitioning wall 14b, an intersection point of the inner partitioning wall 13b and the inner partitioning wall 14a, and an intersection point of the inner partitioning wall 13b and the inner partitioning wall 14b. Likewise, referring to FIG. 7, the storage section 15bb is defined by the inner partitioning walls 13b, 13c in the length direction and the inner partitioning walls 14b, 14c in the width direction, and the outflow openings 17bb, 17cb, 17bc, 17cc are formed to be located respectively at an intersection point of the inner partitioning wall 13b and the inner partitioning wall 14b, an intersection point of the inner partitioning wall 13b and the inner partitioning wall 14c, an intersection point of the inner partitioning wall 13c and the inner partitioning wall 14b, and an intersection point of the inner partitioning wall 13c and the inner partitioning wall 14c.

In the present embodiment, the outflow openings are formed at respective one ends of outflow pipes 170 piercing through the bottom wall 12a of the cooling tank 12 and extending to the vicinity of the liquid level 19. For example, referring to FIG. 7, with respect to the storage section 15bb, the outflow openings 17bb, 17cb, 17bc, 17cc are formed at respective one ends of the outflow pipes 170. The outflow pipes are defined by the inner partitioning walls 13b, 13c in the length direction and the inner partitioning walls 14b, 14c in the width direction and are located respectively at an intersection point of the inner partitioning wall 13b and the inner partitioning wall 14b, an intersection point of the inner partitioning wall 13b and the inner partitioning wall 14c, an intersection point of the inner partitioning wall 13c and the inner partitioning wall 14b, and an intersection point of the inner partitioning wall 13c and the inner partitioning wall 14c. Incidentally, respective other ends of the outflow pipes are foiled with bottom openings 18aa, 18ab, 18ac, 18ad, 18ae, 18ba, 18bb, 18bc, 18bd, 18be, 18ca, 18cb, 18cc, 18cd, 18ce, 18da, 18db, 18dc, 18dd, 18de, 18ea, 18eb, 18ec, 18ed, 18ee (hereafter, occasionally referred to as "bottom openings 18aa to 18ee" collectively), respectively.

Where the outflow openings are defined at the positions where the plurality of inner partitioning walls defining the respective storage sections intersect with one another, an advantage is obtained in that the outflow openings provided for the respective storage sections can be secured to be distributed to four corners of each storage section. For example, at the storage section 15bb, the outflow pipes arranged at the four corners of the section define the outflow openings 17bb, 17bc, 17cb and 17cc. Where the outflow openings are defined like this, one outflow opening can become an outflow opening common to the plurality of storage sections. For example, the outflow opening 17bb is a part of the outflow openings for the storage section 15aa and at the same time, is also a part of the outflow openings for the storage sections 15ab, 15ba and 15bb. The same applies also to the outflow openings 17bc, 17cb and 17cc. However, the positions where the outflow pipes are provided for each storage section and the number of the outflow pipes are discretionary, and one or plural outflow pipes may, of course, be provided in the vicinity of the positions where the plurality of inner partitioning walls defining each storage section intersect with one another. Further, the outflow pipes are not required to be integrated with the inner partitioning walls and may be pipes arranged apart from the inner partitioning walls.

Figure 7:
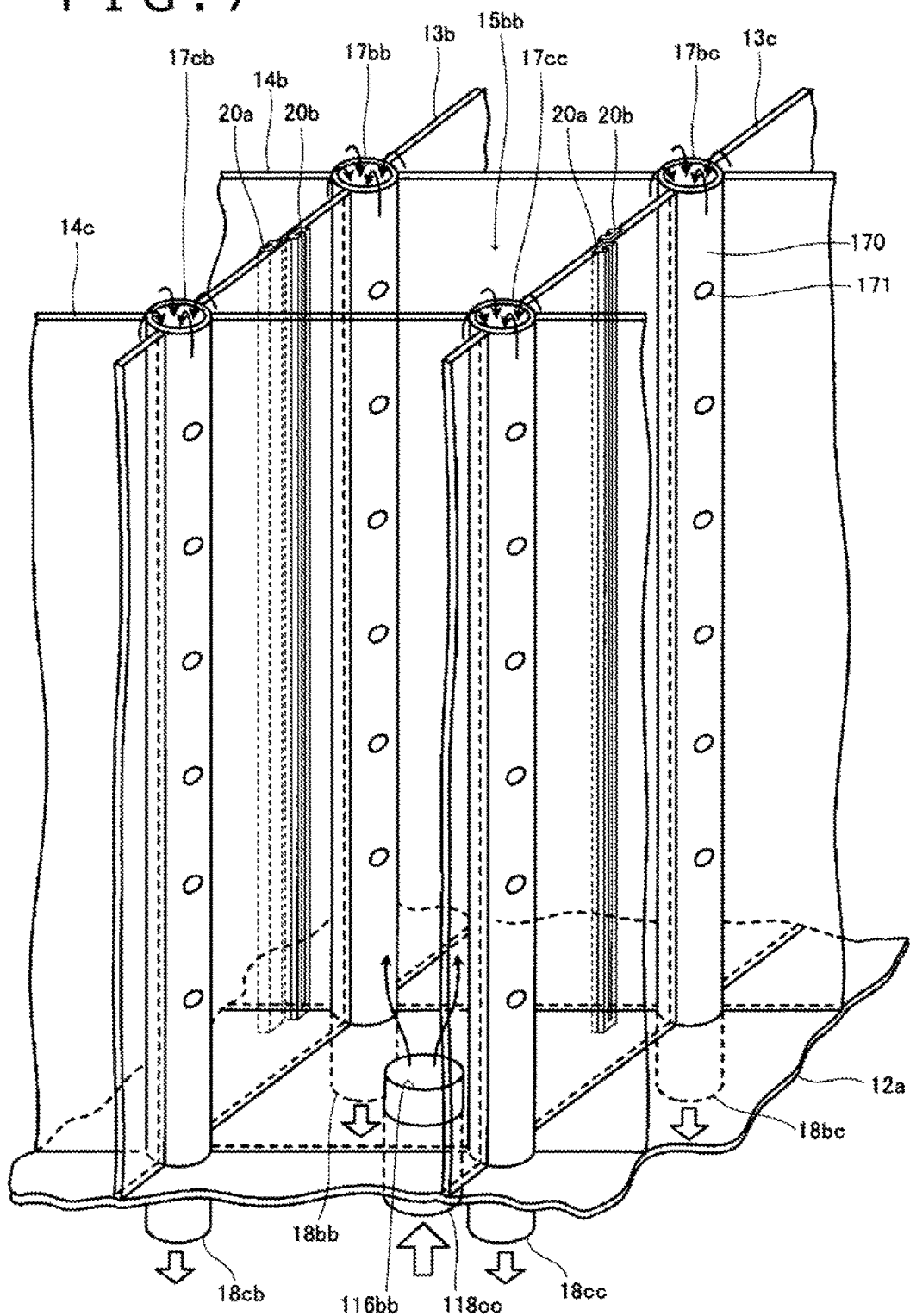
FIG. 7 is a perspective view representing structure of an essential part of the cooling system according to the embodiment of the present invention.
Figure 9:
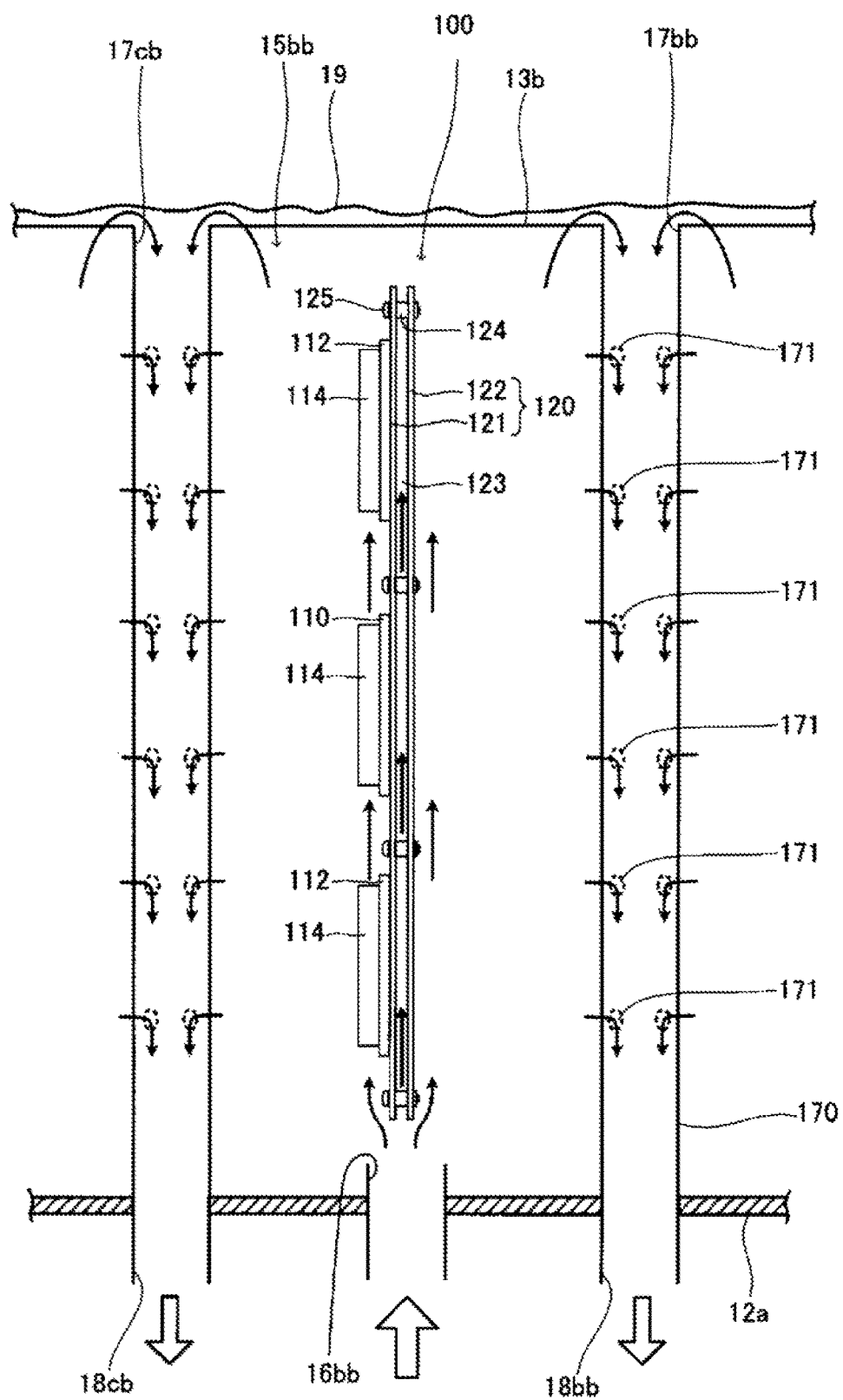
FIG. 9 is a longitudinal sectional view representing structure of an essential part of the cooling system according to the embodiment of the present invention.

Further, as shown in FIGS. 7 and 9, each outflow pipe 170 may be formed with one or more small holes 171 in the longitudinal direction of the outflow pipe 170. These small holes 171 accelerate the flow of the cooling liquid remaining in the midway of the storage section in the depth direction, as described later. On the other hand, each of the inflow openings 16aa to 16dd is not required to be a cylindrical opening, as illustrated. For example, a header with a plurality of nozzles may be connected to one end of a cylinder to define the inflow opening by the plurality of nozzles.

Figure 3:
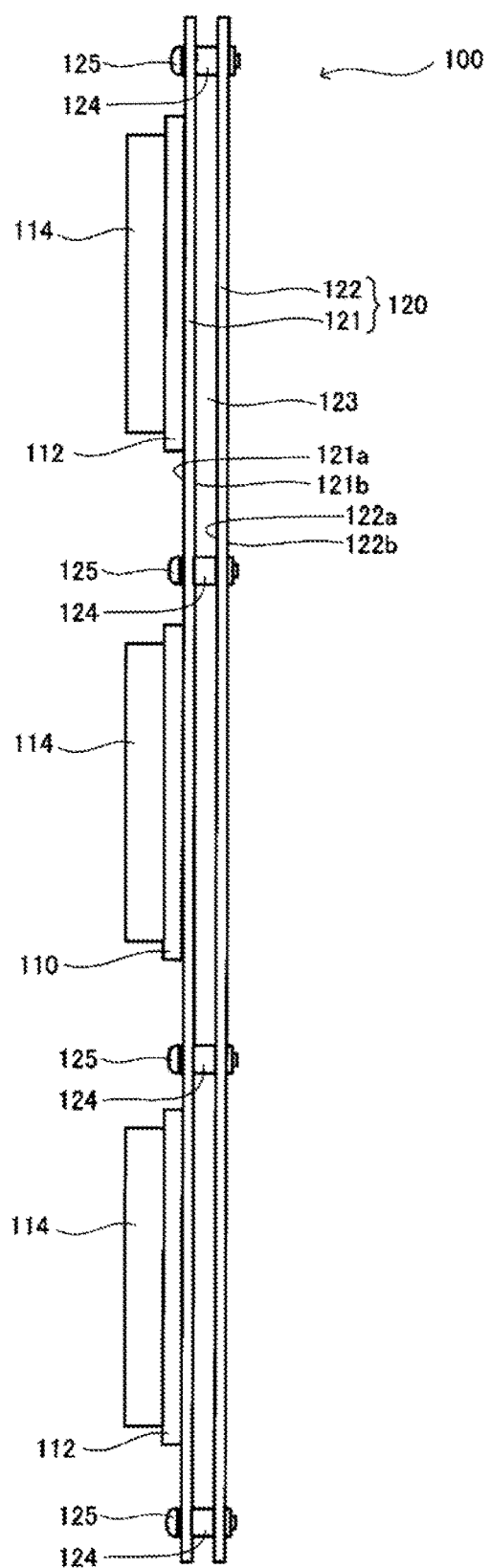
FIG. 3 is a side view of the electronic apparatus according to the embodiment of the present invention.
Figure 4:
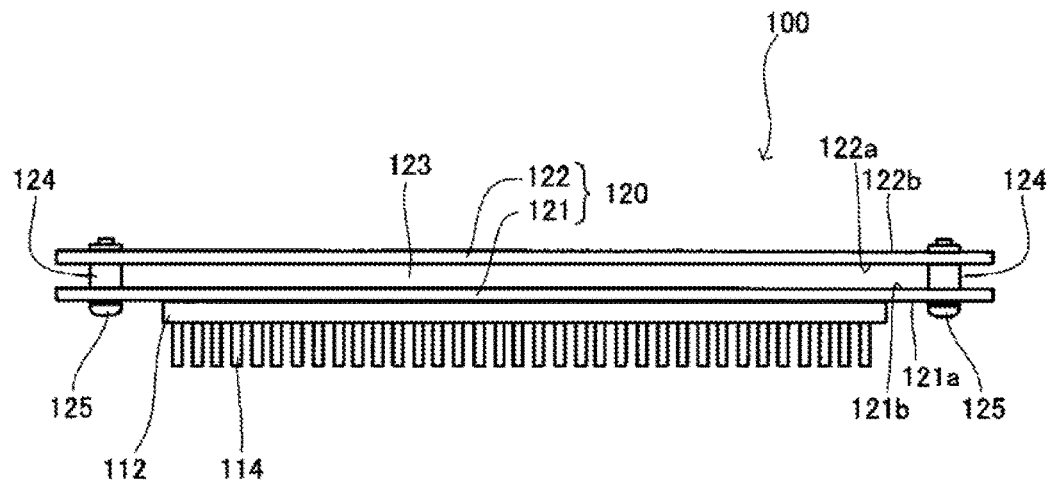
FIG. 4 is a plan view of the electronic apparatus according to the embodiment of the present invention.
Figure 5:
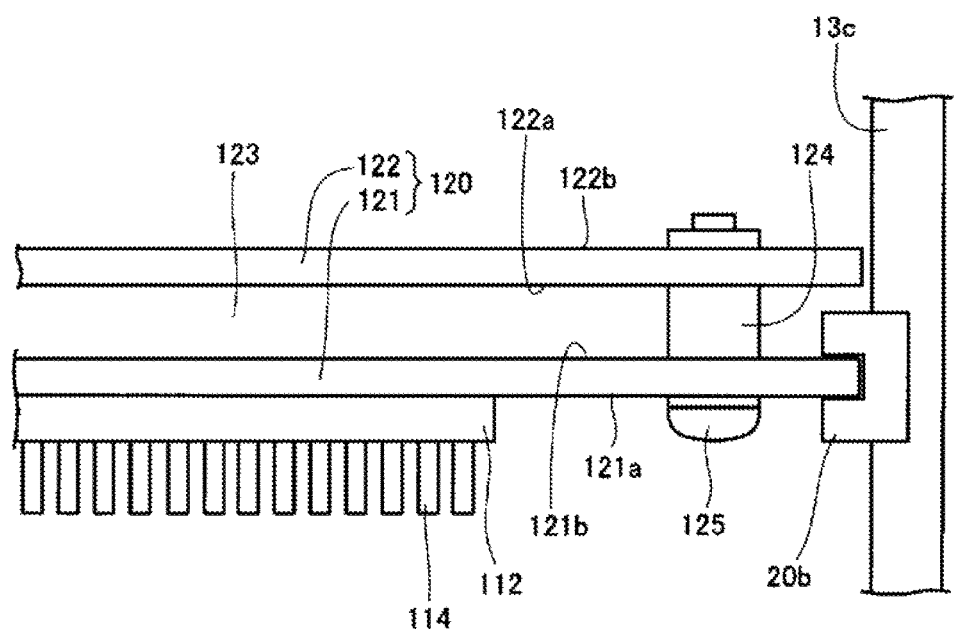
FIG. 5 is an enlarged plan view representing correlation of connection between the electronic apparatus and the cooling system according to the embodiment of the present invention.
Figure 6:
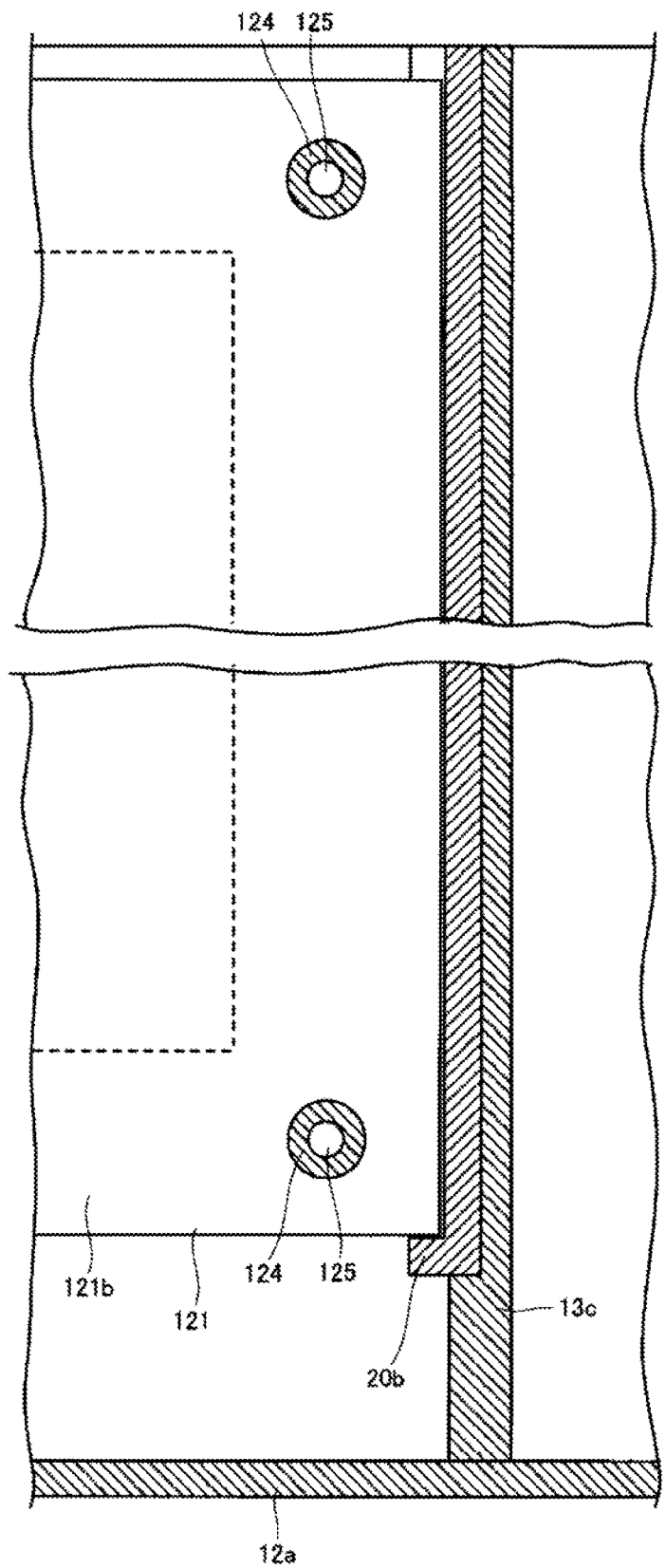
FIG. 6 is an enlarged longitudinal sectional view representing correlation of connection between the electronic apparatus and the cooling system according to the embodiment of the present invention.

Each of the storage sections 15aa to 15dd stores the electronic apparatus 100 immersed in the cooling liquid 11. The electronic apparatus 100 is configured to have a multi-stage board 120. Specifically, the electronic apparatus 100 is configured to have the multi-stage board 120 including a processor board 121 ("first board") on which one processor (CPU) 110 and two processors (GPU) 112 are mounted on a surface 121a ("first surface"), and a board 122 ("second board") having a surface 122a ("third surface") opposite a back surface 121b ("second surface") of the processor board 121. The electronic apparatus further includes a flow channel 123 formed as a gap between the back surface 121b of the processor board 121 and the surface 122a of the board 122. As FIGS. 3, 4, 5 show, the electronic apparatus 100 further includes a plurality of spacers 124 and a plurality of screws 125 for retaining the gap. Each of the screws 125 penetrates through the processor board 121, the board 122, and the spacers 124 for fixation. Each of the processor (CPU) 110 and the processors (GPU) 112 includes a heat radiation members (radiation fins) 114 thermally connected to those processors. In addition to the processors, peripheral electronic parts are mounted on the surface 121a of the processor board 121. Likewise, the peripheral electronic parts are mounted as well on one surface 122b of the board 122. Those electronic parts are not shown in the drawings. It is also possible to mount the peripheral electronic parts on the other surface 122a of the board 122. It is preferable to mount those electronic parts so as not to disturb the cooling liquid flowing through the flow channel 123.

Figure 8:
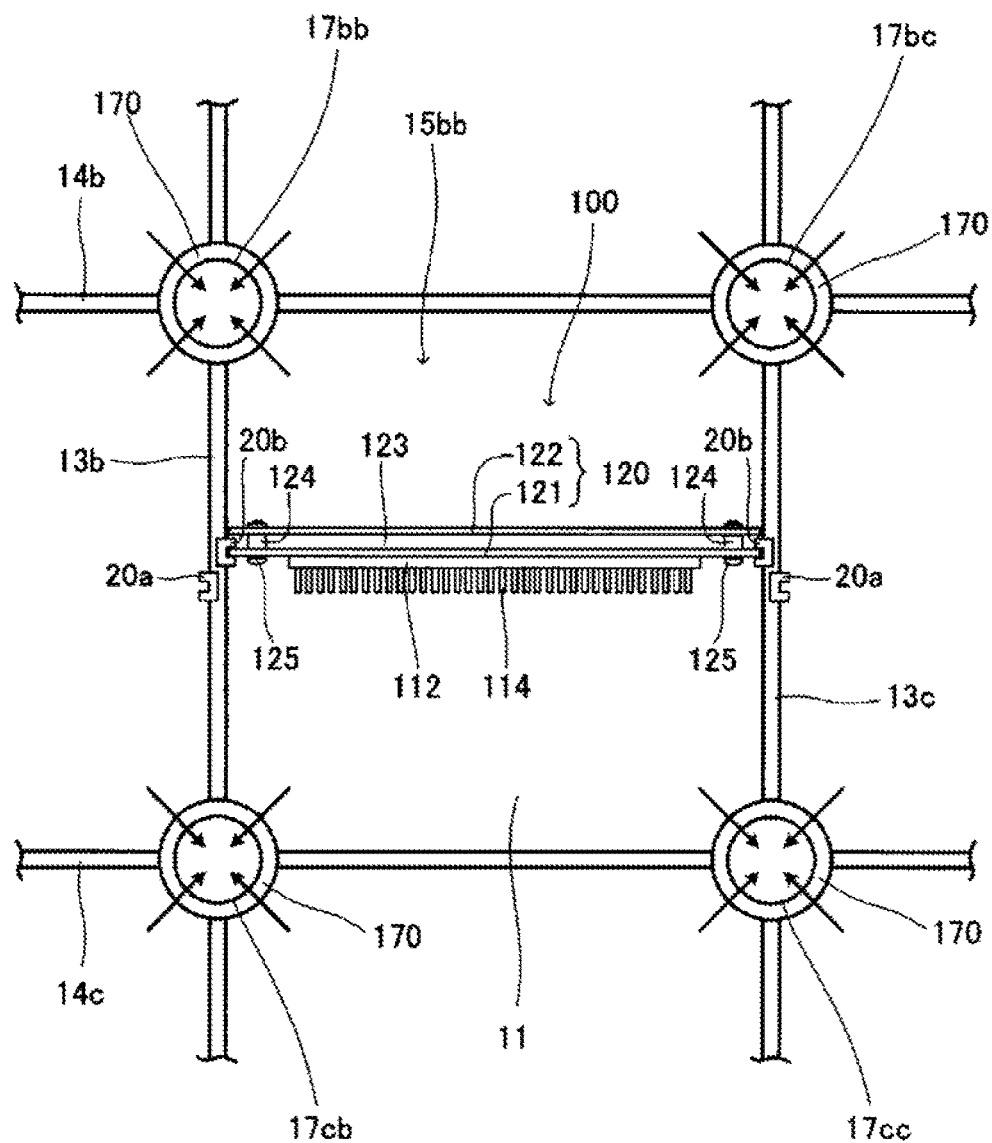
FIG. 8 is a plan view representing structure of an essential part of the cooling system according to the embodiment of the present invention.

As FIGS. 1, 7, 8 show, each of the storage sections 15aa to 15dd includes a pair of board retainers 20a or 20b. The pair of board retainers 20a or 20b are configured to retain the processor board 121 and/or the board 122 of the electronic apparatus 100. Each element of the board retainer is structured so that a groove of a guide rail, through which both side ends of the processor board 121 are inserted has a closed lower end as shown in FIGS. 5, 6, 7, 8. Referring to the example of storing the electronic apparatus 100 in the storage section 15bb as shown in FIGS. 5 to 8, the pair of board retainers 20b serve to retain both side ends of the processor board 121. The board retainers 20a or 20b may be disposed at arbitrary positions on a plurality of inner partitioning walls that constitute the respective storage sections. It is also possible to dispose them as independent elements apart from the inner partitioning walls. As shown in the drawings, the board retainer is fixed by partially embedding the element thereof in the inner partitioning wall as a mere example. The method of fixing the board retainer is not limited to the example as described above.

In the cooling tank 12, the cooling liquid 11 of the amount sufficient to immerse the whole of the electronic device 100 is contained up to the liquid level 19. As the cooling liquid 11, there can preferably be used a fluorine-based inert liquid comprising perfluoride (a perfluorocarbon compound) and known as "Fluorinert (trademark of 3M Company; the same applies hereafter) FC-72" (boiling point: 56° C.), "Fluorinert FC-770" (boiling point: 95° C.), "Fluorinert FC-3283" (boiling point: 128° C.), "Fluorinert FC-40" (boiling point: 155° C.) or "Fluorinert FC-43" (boiling point: 174° C.), the brand names of 3M Company. However, the cooling liquid 11 is not limited to these. Incidentally, Fluorinert FC-40 and Fluorinert FC-43 are higher in boiling point than 150° C. and very difficult to evaporate and therefore, are advantageous because the height of the liquid level 19 can be maintained for a long period of time where ether of them is used as cooling liquid.

Paying attention to the point that perfluoride possesses excellent properties such as ozone depletion potential being zero and the like because of being a compound which is high in electric insulation and in heat transmission capability, is inert and high in thermal and chemical stabilities, is incombustible and does not include oxygen, the present inventor completed an invention of a cooling system in which a cooling liquid including such perfluoride as a main component is used as a refrigerant for immerse cooling of high-density electronic apparatuses, and already filed a patent application (Japanese Patent Application NO. 2014-170616). As disclosed in this preceding application, particularly, Fluorinert FC-43 or Fluorinert FC-40, when used as a cooling liquid, can efficiently cool a plurality of electronic apparatuses set in a high density within a cooling tank of a small volume while greatly reducing the loss attributed to evaporation of the cooling liquid 11 from the cooling tank having the open space, and therefore, is very advantageous. However, this does not particularly intend to impose restrictions on choosing a cooling liquid of another kind.

The cooling tank 12 is provided with an inlet 16 for distributing the cooling liquid 11 through a distribution pipe (not shown) toward the inflow openings 16aa to 16dd provided at the respective storage sections 15aa to 15dd and an outlet 18 for collecting through a collecting pipe (not shown) the cooling liquids passing through the outflow openings 17aa to 17ee of the respective storage sections 15aa to 15dd.

Figure 10:
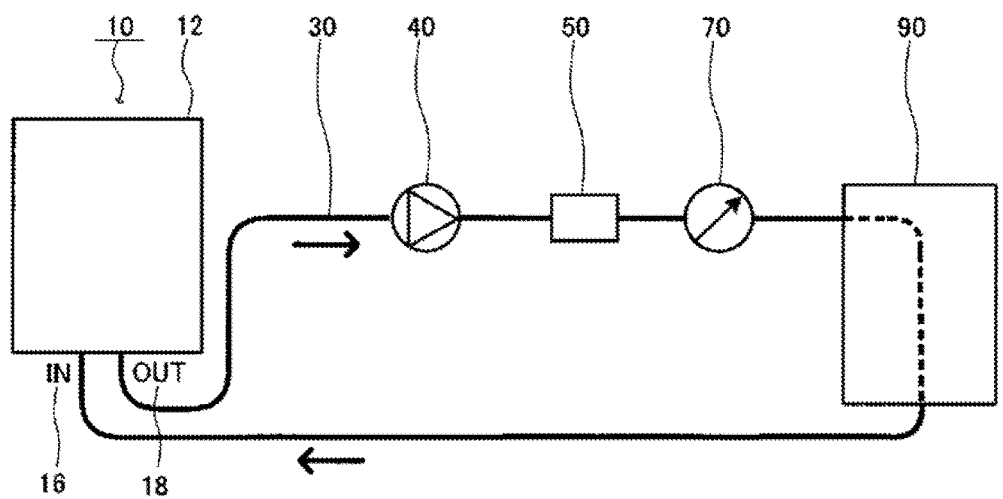
FIG. 10 is a schematic view of the cooling system configured to have a drive system and a cooling system provided in a flow passage for connecting an outlet and an inlet of a cooling tank.

Referring to FIG. 10, in order that the cooling liquid cooled to a predetermined temperature continuously goes through the interiors of the respective storage sections 15aa to 15dd whereby the electronic apparatuses 100 stored in the respective storage sections 15aa to 15dd can be kept at a predetermined temperature or lower during the operations, it is preferable to configure a flow passage 30 that by a heat exchanger, cools the warmed cooling liquid 11 coming out of the outlet 18 of the cooling tank 12 to return the cooled cooling liquid to the inlet 16 of the cooling tank 12. As illustrated, the outlet 18 and the inlet 16 of the cooling tank 12 are connected by the flow passage 30, and the flow passage 30 is provided therein with a pump 40 for moving the cooling liquid 11 and a heat exchanger 90 for cooling the cooling liquid 11. Incidentally, the flow passage 30 is also provided therein a flow regulating valve 50 and a flowmeter 70 for regulating the flow rate of the cooling liquid 11 flowing through the flow passage 30.

It is preferable that the pump 40 possesses a performance capable of moving a liquid being relatively large in kinetic viscosity (exceeding 3 cSt in kinetic viscosity at the room temperature of 25° C.). This is because where for example, Fluorinert FC-43 or FC-40 is used as the cooling liquid 11, the kinetic viscosity of FC-43 is the degree of 2.5 to 2.8 cSt and the kinetic viscosity of FC-40 is the degree of 1.8 to 2.2 cSt. The flow regulating valve 50 may be one operated manually or may be one with a regulating mechanism that keeps the flow rate fixed based on a measured value of the flowmeter 70. In addition, the heat exchanger 90 may be chosen from various heat exchangers (radiators or chillers) and refrigerators of the circulation type.

Next, the operation of the cooling system 10 will be described. The cooling liquid 11 entering at the inlet 16 is distributed through a distribution pipe not shown toward the inflow openings 16aa to 16dd formed at the bottom portions of the storage sections 15aa to 15dd. The cooling liquid 11 is forced upward from the inflow openings 16aa to 16dd and directly cools the three processors 112, 110, 112 and the peripheral electronic components (not shown) being on the surface 121a of the processor board 121 of the electronic apparatus 100. For example, as shown in FIGS. 7 and 9, the cooling liquid 11, when forced upward from the inflow opening 16bb, goes up toward the liquid level 19 while taking away heat from the surfaces of heat radiation members 114 thermally connected to the three processors 112, 110, 112 as well as of the peripheral electronic components (not shown) and further, moves toward the outflow openings 17bb, 17bc, 17cb, 17cc. In this case, each volume of the storage sections 15aa to 15dd is small to be about 1/16 of the volume of the open space 10a of the cooling tank 12, and the electronic apparatus 100 stored therein is also small to be about 1/4 wide of the width of the cooling tank 12. Thus, the cooling efficiency of the electronic apparatus 100 is very excellent, and the cooling fluid 11 can effectively be prevented from remaining around the electronic apparatus 100. Additionally, the electronic apparatus 100 is structured to have the multi-stage board 120, which makes it possible to reduce the thickness of the processor board 121 by reducing the number of layers of the multi-layer wiring for each board so as to be smaller than usual. Accordingly, the heat from the processors 112, 110, 112 mounted on the processor board 121 can be easily transferred to the back surface 121b of the processor board 121. Part of the cooled cooling liquid 11 passing through the respective storage sections 15aa to 15dd takes heat from the back surface 121b of the processor board 121 quickly and efficiently when it passes through the flow channel 123 as the gap between the back surface 121b of the processor board 121 and the surface 122a of the board 122. As described above, the cooling liquid 11 ensures to take heat from both surfaces of the processor board 121 which outputs the large heat value quickly and efficiently, thus improving efficiency for cooling the electronic apparatus.

The cooling liquids having been warmed by taking heat from the electronic apparatuses 100 pass through the outflow openings 17aa to 17ee residing in the vicinity of the liquid level 19 in the cooling tank 12, go down in the outflow pipes 170, pass through the bottom openings 18aa to 18ee and gather at the outlet 18 through the collection pipe (not shown). At this time, since one or more small holes 171 are formed in the longitudinal direction of each outflow pipe 170, the cooling liquid 11 flows inside the outflow pipe 170 through the small holes 171. Accordingly, the cooling liquid 11 being at a mid portion in the depth direction of each storage section is accelerated to flow, and thus, the cooling liquid 11 well spreads over the whole of the multi-stage board 120 of the electronic apparatus 100. Therefore, it becomes possible to cool the peripheral electronic components (not shown) at higher efficiency. Incidentally, in the illustrated example, each outflow pipe 170 is formed with six small holes 171 at fixed intervals. However, this is one example, and a person ordinarily skilled in the art may discretionally determine the number and positions of the small holes.

In the cooling system 10 of the present embodiment, the temperatures of the respective storage sections may be monitored at all times by a controller (not shown), and other flow regulating valves (not shown) may be provided in respective distribution pipes (not shown) extending from the inlet 16 to the inflow openings 16aa to 16dd, the flow regulating valves being for regulating the flow volumes of the cooing liquids passing through the inflow openings 16aa to 16dd of the respective storage sections 15aa to 15dd in response to input signals that the controller transmits in dependence on the temperature variations in the respective storage sections. Where the configuration is taken like this, by individually regulating the flow volumes of cooling liquids passing through the respective storage sections, it becomes possible to individually control the intensities in cooling the electronic apparatuses by the cooling liquids, and hence, it is possible to control the performances in cooling the plurality of electronic apparatuses more accurately.

In the cooling system 10 of the present embodiment, the respective storages sections 15aa to 15dd may be provided therein with first temperature sensors (not shown) for liquid, and there may be further provided a mechanism (not shown) that, when a predetermined temperature or higher is detected by the first temperature sensor, discontinues the operation of the electronic apparatus 100 stored in the storage section of which such a high temperature is detected, or interrupts the power supply to the electronic apparatus 100. By the provision of such a fail-safe mechanism, the cooling liquid 11 flowing through each storage section can be prevented from rising to an unusual temperature exceeding a set temperature, and hence, it can be realized to prevent the electronic apparatuses from being damaged and to prevent a harmful compound from being generated from fluorocarbon.

Further, in the cooling system 10 of the present embodiment, as another configuration of the fail-safe mechanism, a second temperature sensor (not shown) may be provided in the electronic apparatus 100 stored in each of the storage sections 15aa to 15dd or in a surrounding area of the electronic apparatus 100 stored in each of the storage sections 15aa to 15dd, and a mechanism (not shown) may be further provided that discontinues the operation of the electronic apparatus 100 or interrupts the power supply to the electronic apparatus 100 when a predetermined temperature or higher is detected by the second temperature sensor.

In the above-described embodiment, the electronic apparatus 100 is configured to have the multi-stage board 120 with two-stage structure including the single processor board 121 and the single board 122. The electronic apparatus may be configured to have the multi-stage board with three or more stages. For example, it may be configured to have three-stage structure including two processor boards and one board. The back surface of one of the processor boards is arranged to face one surface of the single board so as to form a first flow channel. Meanwhile, the other surface of the single board is arranged to face the back surface of the other processor board to form a second flow channel. The above-described structure as the example allows the cooling liquid to take heat from both surfaces of the processor board that outputs large heat value quickly and efficiently. This makes it possible to improve efficiency for cooling the electronic apparatus, similar to the one derived from the embodiment as described above.

Each of the plurality of electronic apparatus which are cooled in the cooling system is connected to an external power source and an external control unit via the power source line and the signal line (not shown) extending from the open side of the cooling tank. Owing to the multi-board structure of the electronic apparatus, and increase in the number of units, the respective numbers of the power source lines and the signal lines connected to the electronic apparatus become huge to cause problems of disturbing movement of the refrigerant that is indispensable for effective cooling of the electronic apparatuses, reduced cooling efficiency owing to lowered fluidity of the refrigerant in spite of improved cooling efficiency by means of the multi-stage board, and complicated handling such as installation and maintenance of the electronic apparatus. According to the present invention, the aforementioned problems may be solved by using a pair of board retainers for setting the power source line and/or the signal line, and electrically interconnecting the fixing parts for fixing the multi-stage boards of the electronic apparatuses. A plurality of embodiments will be described referring to FIGS. 11 to 21.

Figure 11:
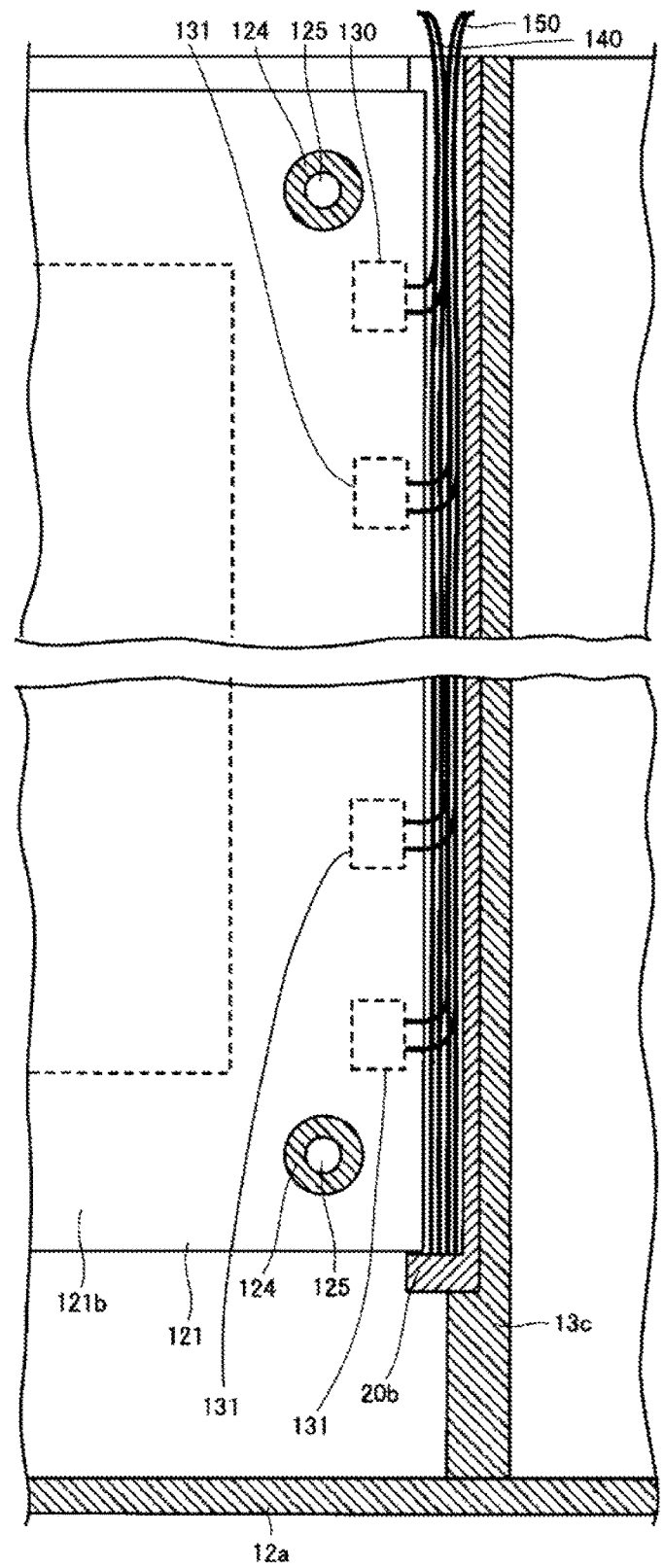
FIG. 11 is an enlarged longitudinal sectional view representing correlation of connection between the electronic apparatus and the cooling system according to another embodiment of the present invention.
Figure 12:
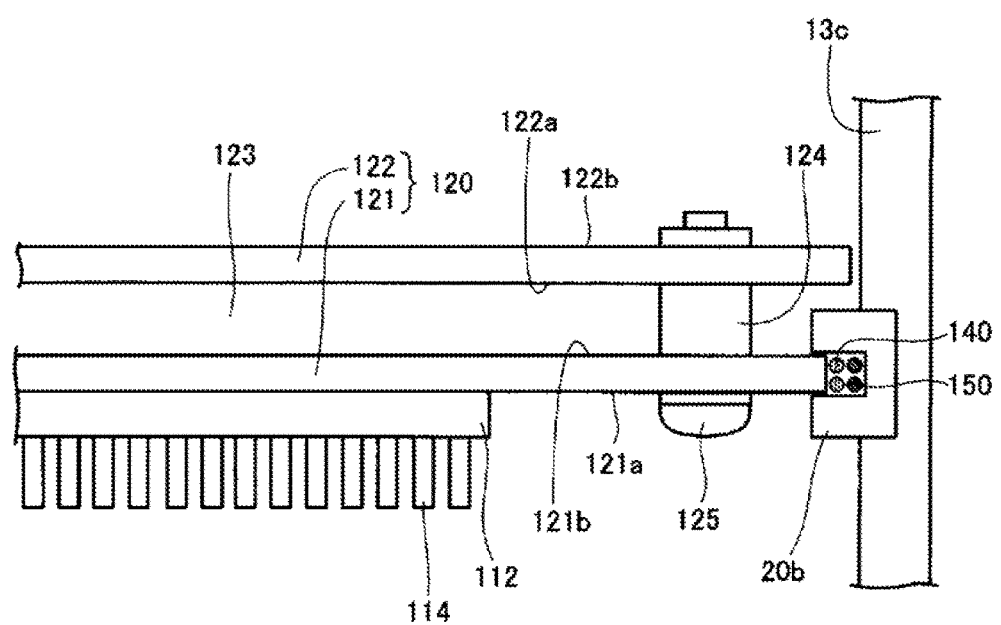
FIG. 12 is an enlarged plan view representing correlation of connection between the electronic apparatus and the cooling system according to the embodiment of the present invention.

FIGS. 11 and 12 represent correlation of connection between the electronic apparatus 100 and the cooling system 10 according to another embodiment. In this embodiment, a power source line 140 and a signal line 150 are disposed at each gap between both side ends of the processor board 121 of the electronic apparatus 100 and the board retainers 20b of the inner partitioning wall 13c of the cooling system 10. The power source line 140 is connected to a connector 130 on the surface 121a of the processor board 121. On the other hand, the signal line 150 is connected to a connector 131 on the surface 121a. The power source line 140 and the signal line 150 may have bus structures so as to be branched from arbitrary locations in the longitudinal direction.

Figure 13:
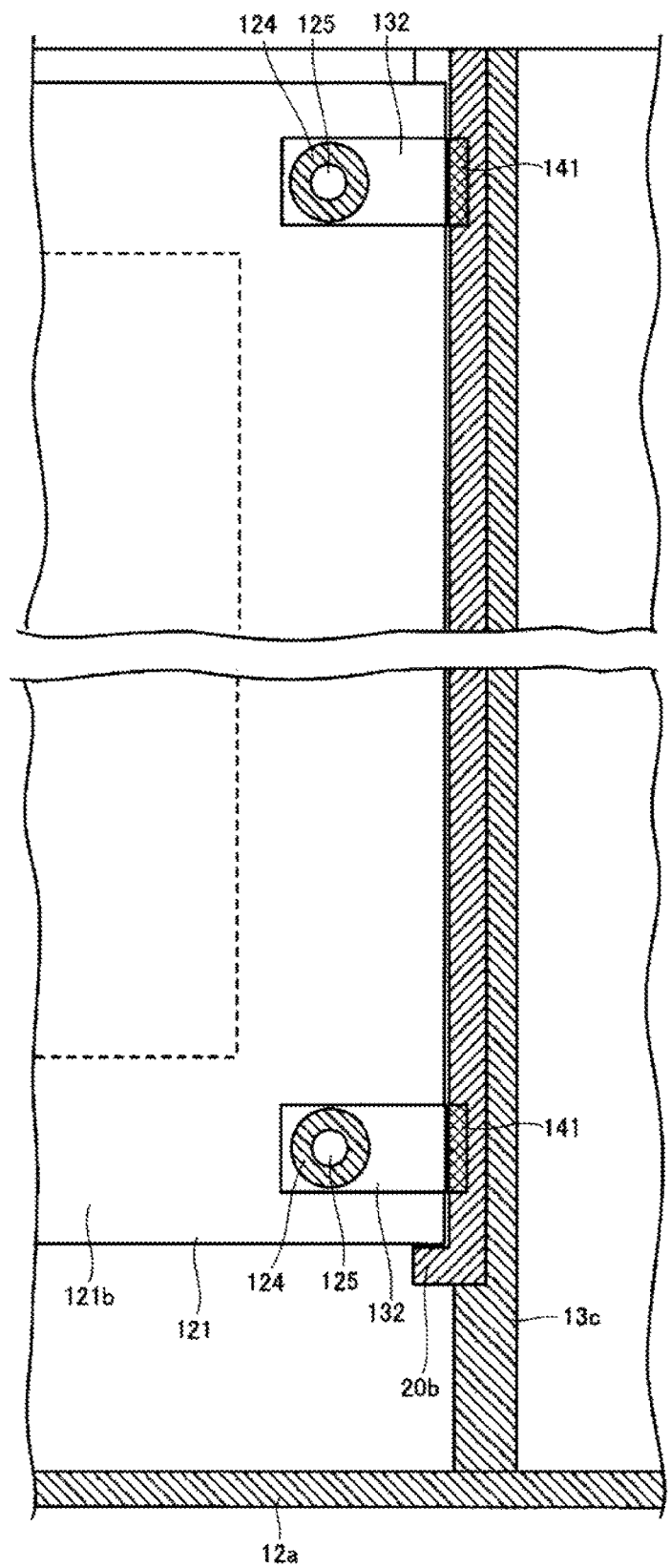
FIG. 13 is an enlarged longitudinal sectional view representing correlation of connection between the electronic apparatus and the cooling system according to another embodiment of the present invention.
Figure 14:
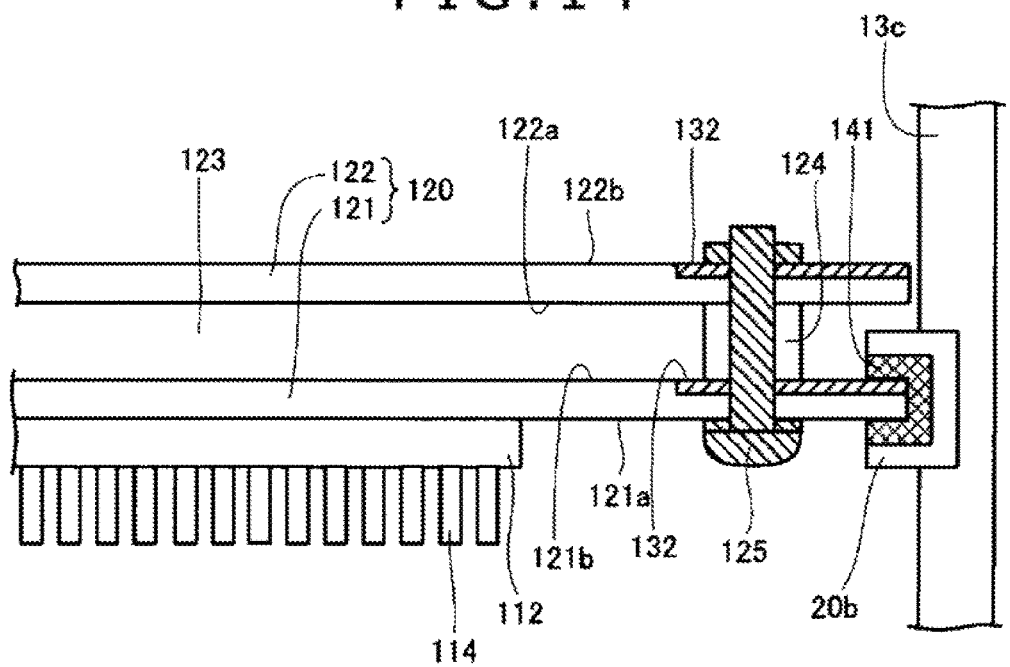
FIG. 14 is an enlarged fragmentary sectional view representing correlation of connection between the electronic apparatus and the cooling system according to the embodiment of the present invention.

FIGS. 13 and 14 represent correlation of connection between the electronic apparatus 100 and the cooling system 10 according to another embodiment. In this embodiment, a power source line 141 is embedded in the groove of the board retainer 20b formed in the inner partitioning wall 13c of the cooling system 10. A strip-shaped electric contact 132 is formed on the back surface 121b of the processor board 121 of the electronic apparatus 100 at both side ends. The part of the strip-shaped electric contact 132 around an insertion hole for the screw 125 has the width substantially the same as each value of the largest diameters of the head of the screw 125 and the nut, and the diameter of the spacer 124. The similar shaped electric contact 132 is provided on the surface 122b of the board 122. Those two electric contacts are electrically coupled with each other via a conductive screw. Setting of the electronic apparatus 100 by inserting its side end into the groove of the board retainer 20b electrically couples the power source line 141 with the electric contact 132 of the processor board 121. This allows not only supply of power from the power source line 141 to the processor 112 and the peripheral electronic parts via the electric contact 132 on the processor board 121, but also supply of power to the electronic parts on the board 122 via the electric contact 132 on the processor board 121, the screw 125, and the electric contact 132 on the board 122. It is also possible to use the signal line 150 instead of the power source line 141 so as to transfer the electric signal through the above-described path.

Figure 15:
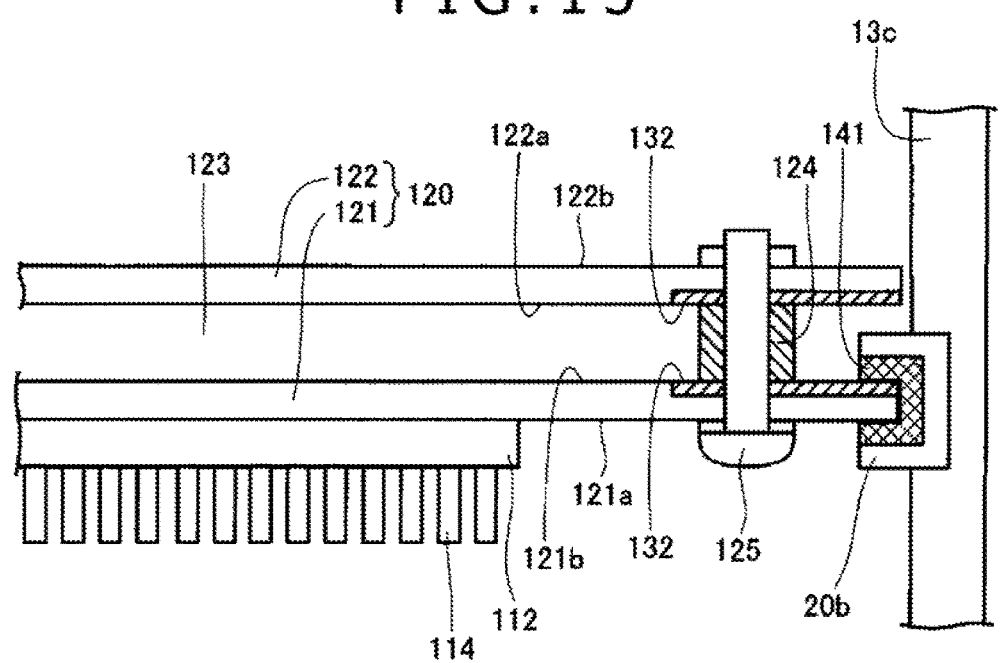
FIG. 15 is an enlarged fragmentary sectional view representing correlation of connection between the electronic apparatus and the cooling system according to another embodiment of the present invention.

FIG. 15 represents correlation of connection between the electronic apparatus 100 and the cooling system 10 according to another embodiment. In this embodiment, the strip-shaped electric contact 132 is disposed on the surface 122a of the board 122. The electric contact 132 on the back surface 121b of the processor board 121 is electrically coupled with the electric contact 132 on the surface 122a of the board 122 via the conductive spacer 124. In this embodiment, the screw 125 may not have to be conductive. Other constituting parts are similar to those described referring to FIGS. 13 and 14. This embodiment allows not only supply of power from the power source line 141 to the processor 112 and the peripheral electronic parts via the electric contact 132 on the processor board 121, but also supply of power to the electronic parts on the board 122 via the electric contact 132 on the processor board 121, the spacer 124, and the electric contact 132 on the board 122. It is also possible to use the signal line 150 instead of the power source line 141 so as to transfer the electric signal through the above-described path.

Figure 16:
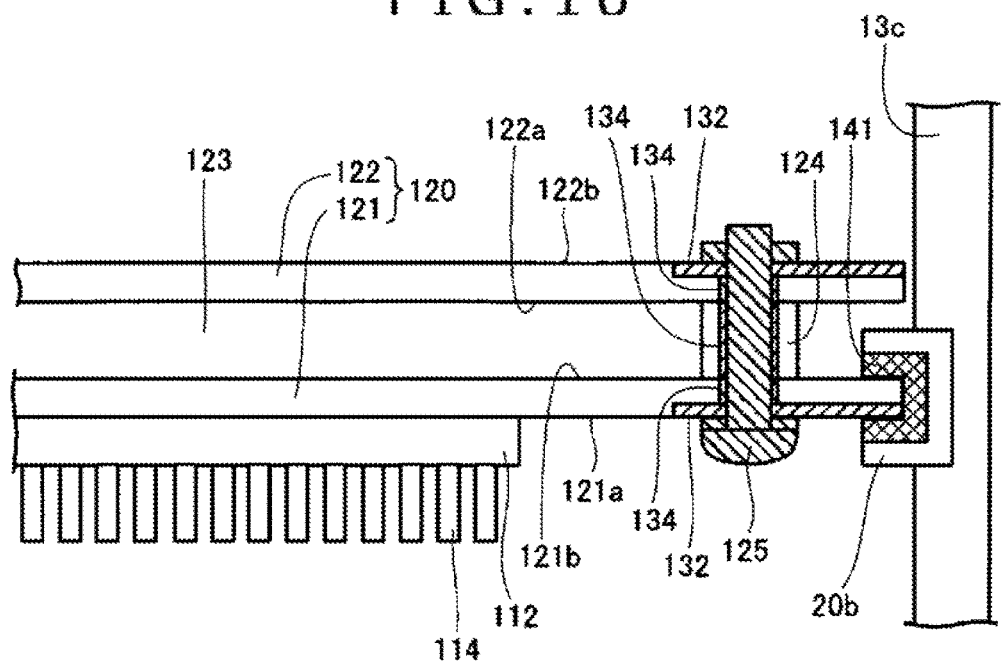
FIG. 16 is an enlarged fragmentary sectional view representing correlation of connection between the electronic apparatus and the cooling system according to another embodiment of the present invention.

FIG. 16 represents correlation of connection between the electronic apparatus 100 and the cooling system 10 according to another embodiment. In this embodiment, the strip-shaped electric contact 132 is disposed on the surface 121a of the processor board 121. A conductive hole 134 through which the screw 125 penetrates is formed in the spacer 124. Likewise, the conductive hole 134 through which the screw 125 penetrates is formed in the processor board 121 and the board 122. The electric contact 132 on the surface 121a of the processor board 121 is electrically coupled with the electric contact 132 on the surface 122b of the board 122 via the conductive screw 125 and the conductive hole 134. Other constituting parts are similar to those described referring to FIGS. 13 and 14.

Figure 17:
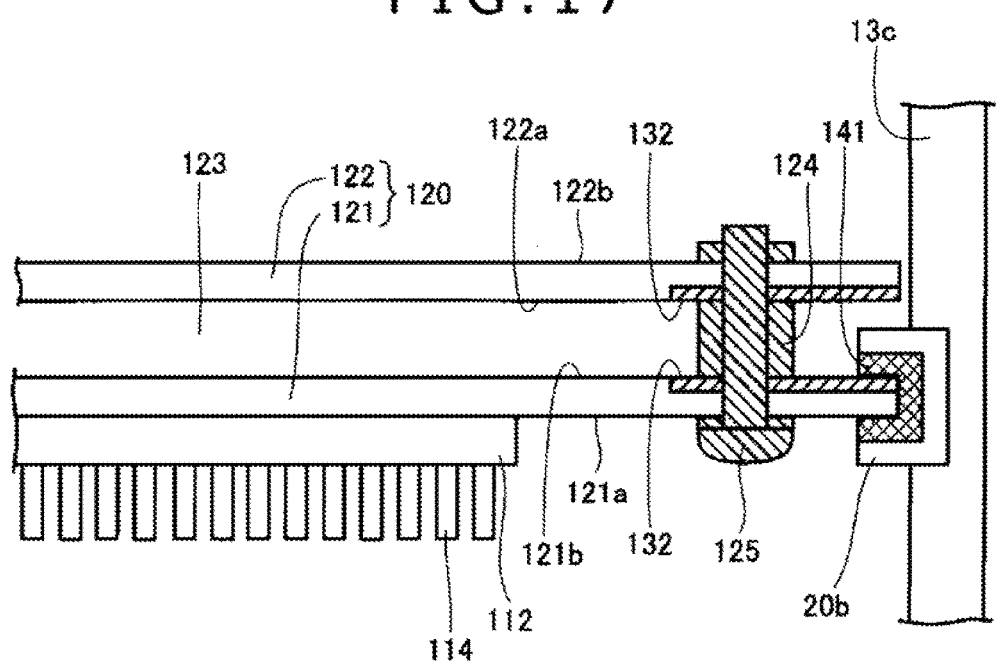
FIG. 17 is an enlarged fragmentary sectional view representing correlation of connection between the electronic apparatus and the cooling system according to another embodiment of the present invention.

FIG. 17 represents correlation of connection between the electronic apparatus 100 and the cooling system 10 according to another embodiment. The structure of this embodiment is similar to the one as shown in FIG. 15 except that the conductive screw is employed as the screw 125.

Figure 18:
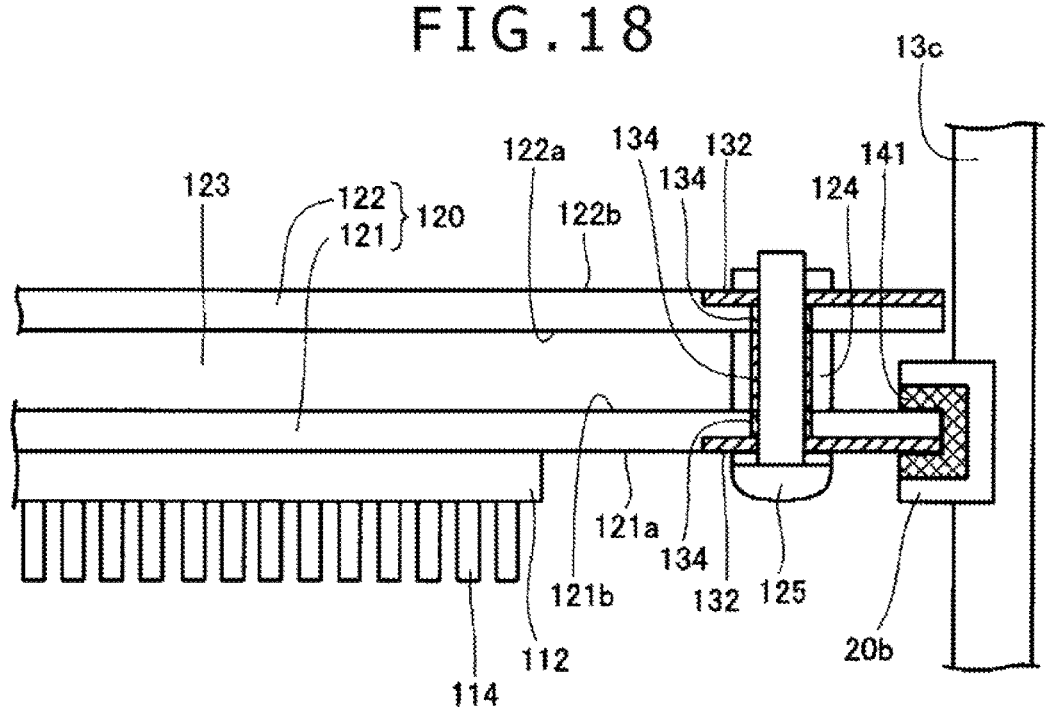
FIG. 18 is an enlarged fragmentary sectional view representing correlation of connection between the electronic apparatus and the cooling system according to another embodiment of the present invention.

FIG. 18 represents correlation of connection between the electronic apparatus 100 and the cooling system 10 according to another embodiment. The structure of this embodiment is similar to the one as shown in FIG. 16 except that the non-conductive screw is employed as the screw 125.

Figure 19:
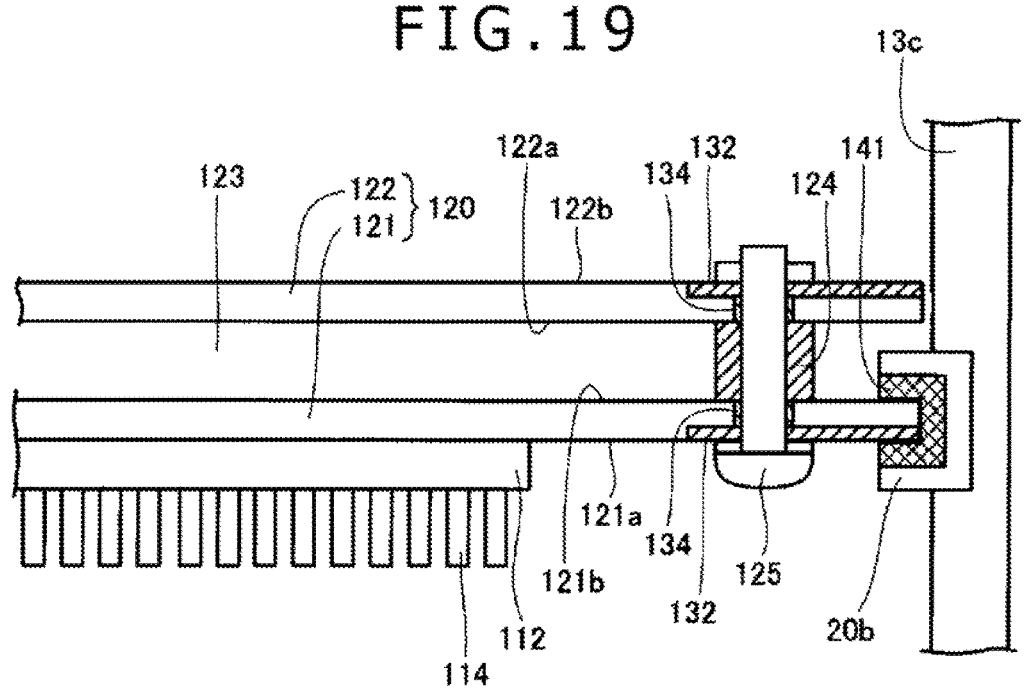
FIG. 19 is an enlarged fragmentary sectional view representing correlation of connection between the electronic apparatus and the cooling system according to another embodiment of the present invention.

FIG. 19 represents correlation of connection between the electronic apparatus 100 and the cooling system 10 according to another embodiment. The structure of this embodiment is similar to the one as shown in FIG. 18 except that the conductive spacer is employed as the spacer 124.

Figure 20:
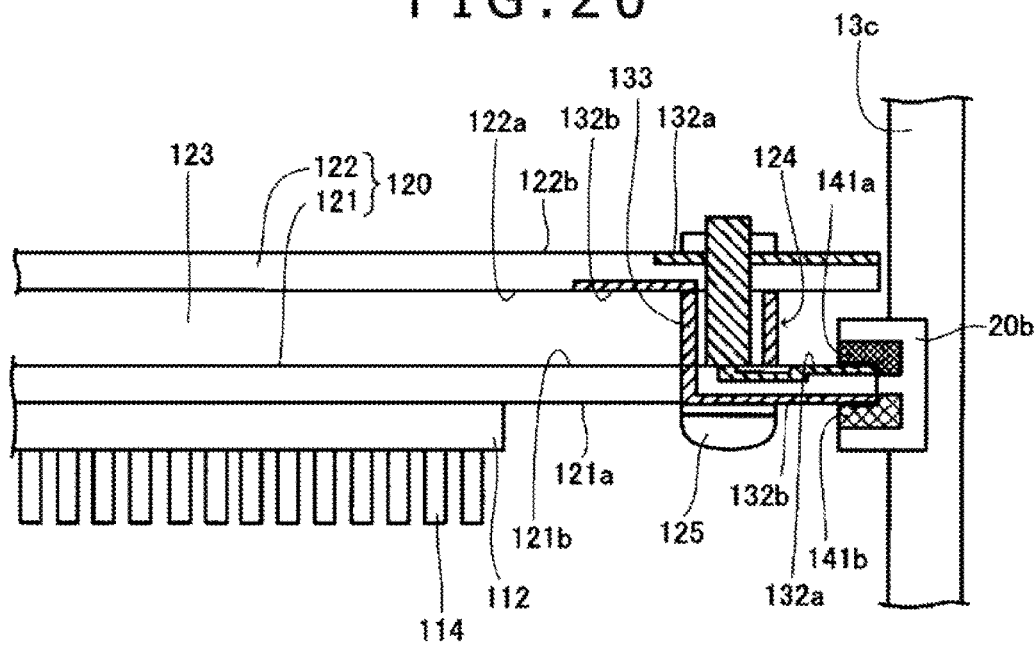
FIG. 20 is an enlarged fragmentary sectional view representing correlation of connection between the electronic apparatus and the cooling system according to another embodiment of the present invention.

FIG. 20 represents correlation of correction between the electronic apparatus 100 and the cooling system 10 according to another embodiment. In this embodiment, a strip-shaped electric contact 132b is disposed on the surface 121a of the processor board 121, and another strip-shaped electric contact 132a is disposed on the back surface 121b of the processor board 121. The electric contact 132b is disposed on the surface 122a of the board 122, and the electric contact 132a is disposed on the surface 122b of the board 122. The spacer 124 includes an internal insulating part through which the conductive screw 125 penetrates, and an external conductive collar 133. The electric contact 132b on the surface 121a of the processor board 121 is electrically coupled with the conductive collar 133 of the spacer 124 via a conductor which penetrates through the processor board 121. The electric contact 132b on the surface 122a of the board 122 is electrically coupled with the conductive collar 133 of the spacer 124. Additionally, the electric contact 132a on the back surface 121b of the processor board 121 is electrically coupled with the conductive screw 125 via the conductor inside the processor board 121. The electric contact 132a on the surface 122b of the board 122 is electrically coupled with the conductive screw 125. Especially, in this embodiment, a positive electrode power source line 141a, and a negative electrode power source line 141b are embedded in the insulating board retainer 20b of the inner partitioning wall 13c while maintaining electric insulation properties of the respective lines. Upon setting of the electronic apparatus 100 by inserting the side end of the processor board 121 into the groove of the board retainer 20b, the electric contact 132a of the processor board 121 is electrically coupled with the positive electrode power source line 141a, and simultaneously, the electric contact 132a of the board 122 is electrically coupled with a positive electrode power source line 141a via the conductive screw 125 and the electric contact 132a of the processor board 121. Likewise, the electric contact 132b of the processor board 121 is electrically coupled with the negative electrode power source line 141b, and simultaneously, the electric contact 132b of the board 122 is electrically coupled with the negative electrode power source line 141b via the external conductive collar 133 of the spacer 124, and the electric contact 132b of the processor board 121. This allows supply of power from the positive electrode power source line 141a, and the negative electrode power source line 141b not only to the processor 112 and the peripheral parts via the electric contacts 132a, 132b on the processor board 121, but also to the electronic parts on the board 122 via the electric contacts 132a, 132b on the processor board 121, the conductive screw 125, the conductive collar 133, and the electric contacts 132a, 132b on the board 122.

Figure 21:
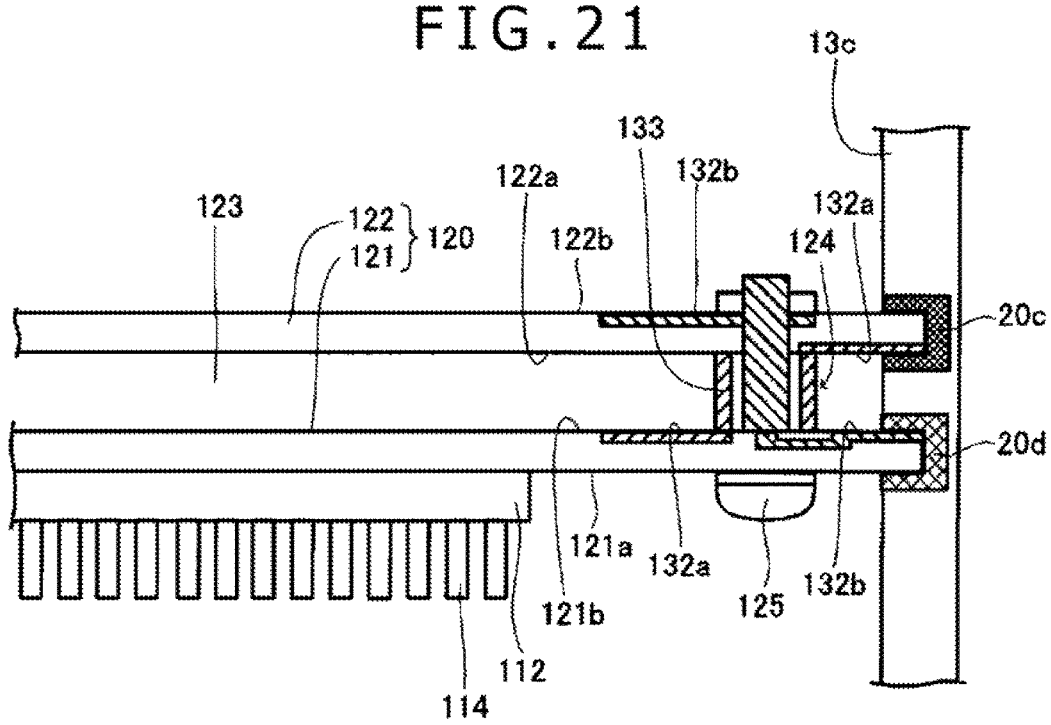
FIG. 21 is an enlarged fragmentary sectional view representing correlation of connection between the electronic apparatus and the cooling system according to another embodiment of the present invention.

FIG. 21 represents the correlation of connection between the electronic apparatus 100 and the cooling system 10 according to another embodiment. Especially, this embodiment is configured to have the conductive board retainers 20c, 20d embedded in the insulating inner partitioning wall 13c, and to apply positive voltage to the conductive board retainer 20c, and negative voltage to the conductive board retainer 20d upon operations of the electronic apparatus 100 and the cooling system 10. During operation, the conductive board retainer 20c functions as the positive electrode power source line, and the conductive board retainer 20d functions as the negative electrode power source line. The strip-shaped electric contact 132b is disposed near the side end, and the electric contact 132a is disposed near the inner side on the back surface 121b of the processor board 121. The electric contact 132a is disposed on the surface 122a of the board 122. The electric contact 132b is disposed on the surface 122b of the board 122. Likewise the example as shown in FIG. 20, the spacer 124 includes the internal insulating part through which the conductive screw 125 penetrates, and the external conductive collar 133. The electric contact 132b on the back surface 121b of the processor board 121 is electrically coupled with the conductive screw 125 via the conductor in the processor board 121. The electric contact 132a of the processor board 121 is electrically coupled with the conductive collar 133 of the spacer 124. The electric contact 132a on the surface 122a of the board 122 is electrically coupled with the conductive collar 133 of the spacer 124. The electric contact 132b on the surface 122b of the board 122 is electrically coupled with the conductive screw 125. Upon setting of the electronic apparatus 100 by inserting the side end of the board 122 into the groove of the board retainer 20c, and inserting the side end of the processor board 121 into the groove of the board retainer 20d, respectively, the electric contact 132a of the board 122 is electrically coupled with the board retainer 20c functioning as the positive electrode power source line. Simultaneously, the electric contact 132a of the processor board 121 is electrically coupled with the board retainer 20c via the external conductive collar 133 of the spacer 124. Likewise, the electric contact 132b of the processor board 121 is electrically coupled with the board retainer 20d functioning as the negative electrode power source line. Simultaneously, the electric contact 132b of the board 122 is electrically coupled with the board retainer 20d via the conductive screw 125, and the electric contact 132b of the processor board 121. This allows supply of power from the board retainers 20c, 20d to the processor and the peripheral electronic parts on the processor board 121, and the electronic parts on the board 122 via those electric contacts 132a, 132b, the conductive screw 125, and the conductive collar 133. The power source line and the signal line may not have to be constituted as the member different from the board retainer. It is possible to allow the board retainer to function as the power source line or the signal line likewise the above-described embodiment.

Each of the above-described embodiments shown in FIGS. 11 to 21 is configured to have the multi-stage board structure, and increase the number of units to solve the following problems. That is, huge numbers of the power source lines and the signal lines disturb movement of the refrigerant indispensable for effective cooling of the electronic apparatuses, cooling efficiency is reduced because of lowered fluidity of the refrigerant in spite of improved cooling efficiency by means of the multi-stage board structure, and handling of the electronic apparatus such as installation and maintenance becomes complicated.

Although in the foregoing one embodiment shown in FIGS. 1, 7 to 9, description has been made of the example wherein the inflow opening is formed at the bottom portion of each storage section. The inflow opening may be formed at a side surface of each storage section. Hereinafter, a cooling system according to another embodiment of the present invention will be described with reference to FIGS. 22 and 23, and a cooling system according to still another embodiment of the present invention will be described with reference to FIG. 24.

Figure 22:
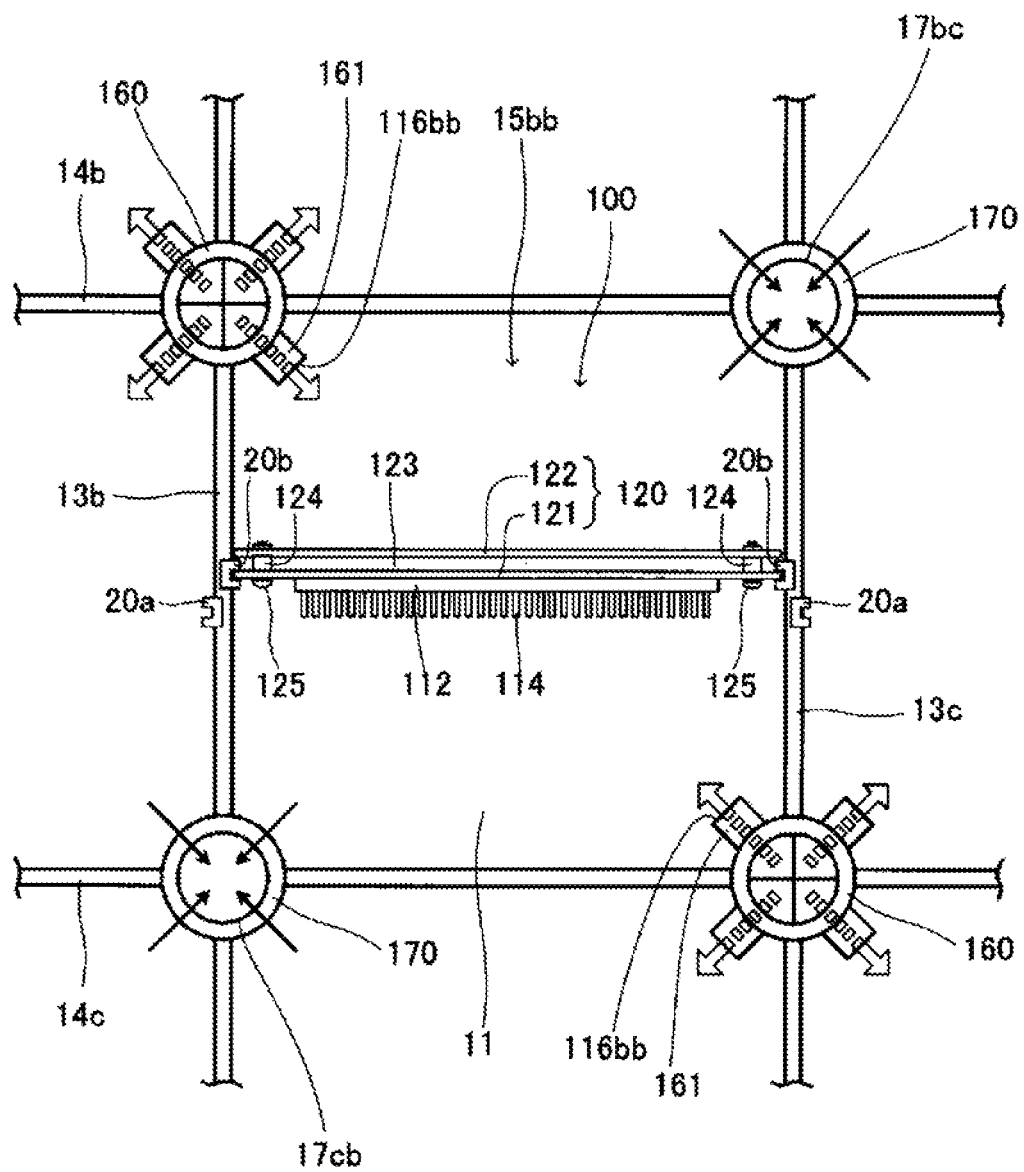
FIG. 22 is a plan view representing structure of an essential part of the cooling system according to another embodiment of the present invention.
Figure 23:
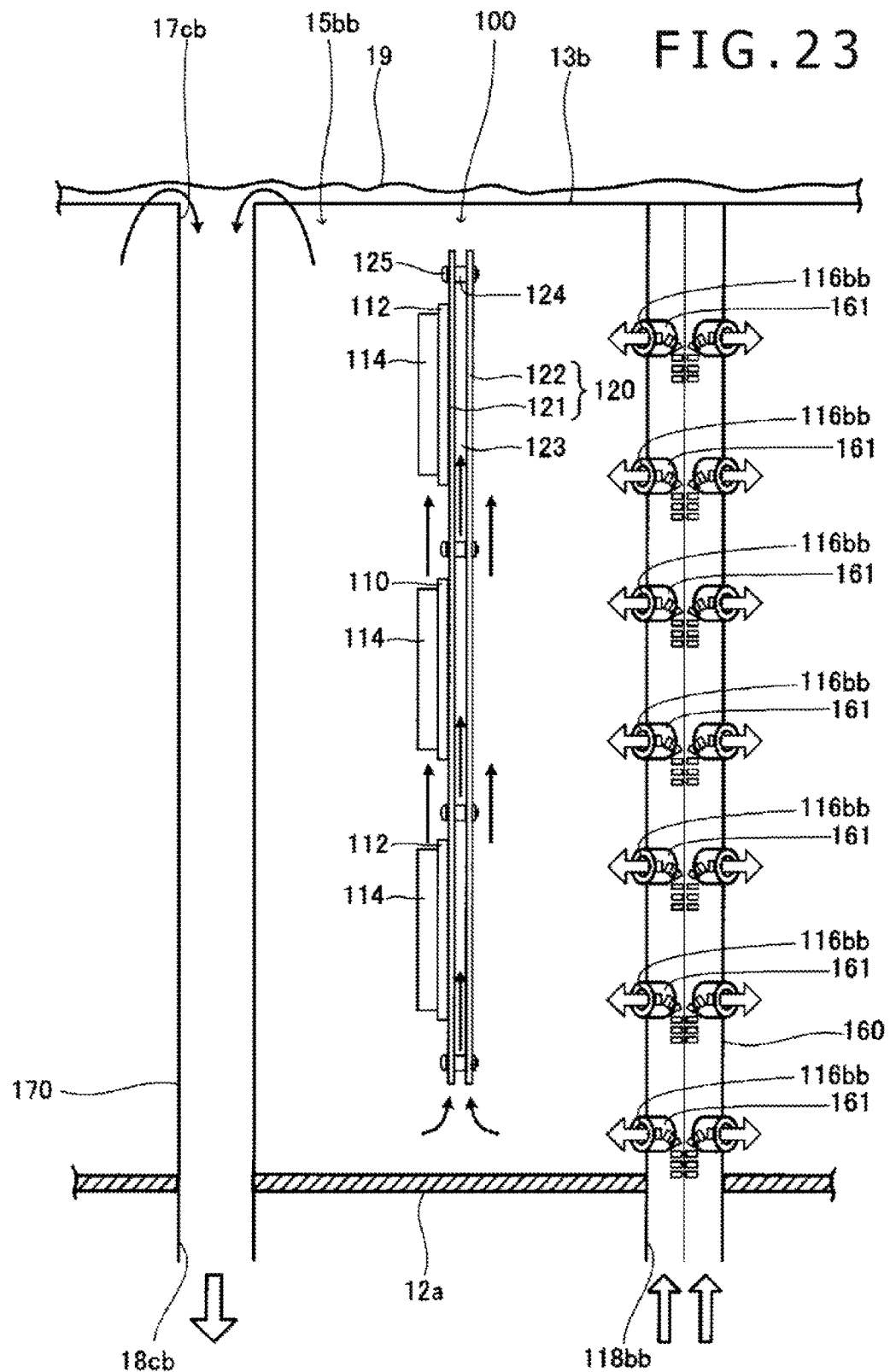
FIG. 23 is a longitudinal sectional view representing structure of an essential part of the cooling system according to another embodiment of the present invention.

FIGS. 22 and 23 are respectively a plan view and a longitudinal sectional view showing the configuration of an important portion of the cooling system according to another embodiment of the present invention. Instead of being formed at the bottom portion of each of the storage sections 15aa to 15dd of the cooling system 10, the inflow opening for the cooling liquid 11 is formed by inflow pipes 160 that are provided at side surfaces of each of the storage sections 15aa to 15dd. That is, the cooling system 10 is further provided with the inflow pipes 160 that pierce through the bottom wall 12a to extend to the vicinity of the liquid level 19. The inflow pipes 160 each have a plurality of nozzles 161 in the longitudinal direction of the inflow pipes 160, and the plurality of nozzles 161 are formed with inflow openings 116aa, 116ab, 116ac, 116ad, 116ae, 116ba, 116bb, 116bc, 116bd, 116be, 116ca, 116cb, 116cc, 116cd, 116ce, 116da, 116db, 116dc, 116dd, 116de, 116ea, 116eb, 116ec, 116ed, 116ee (hereafter, occasionally referred to as "outflow openings 116aa to 116ee" collectively).

In the present embodiment, the inflow pipes 160 and the outflow pipes 170 may be alternately arranged at the positions where the plurality of inner partitioning walls defining each of the respective storage sections 15aa to 15dd intersect with one another, or in the vicinity of the positions. Therefore, referring to FIG. 22 for example, the storage section 15bb is defined by the inner partitioning walls 13b, 13c in the length direction and the inner partitioning walls 14b, 14c in the width direction, and the outflow pipes 170 are arranged respectively at a point where the inner partitioning wall 13b intersects with the inner partitioning wall 14c and a point where the inner partitioning wall 13c intersects with the inner partitioning wall 14b. It is the same as those in FIG. 8 that the outflow openings 17cb, 17bc are respectively formed at the upper ends of the outflow pipes 170. On the other hand, the inflow pipes 160 are arranged respectively at a point where the inner partitioning wall 13*b* intersects with the inner partitioning wall 14*b* and a point where the inner partitioning wall 13*c* intersects with the inner partitioning wall 14*c*. The inflow pipe 160 has the plurality of nozzles 161 in the longitudinal direction, and the plurality of nozzles are respectively formed with inflow openings 116*bb*. Incidentally, the inflow pipe and the outflow pipe are not required to be integrated with the inner partitioning walls and may be pipes arranged apart from the inner partitioning walls.

Referring to FIG. 22, each inflow pipe 160 takes a structure that the interior is divided into four divisions, and is configured to make the cooling liquid 11 flowing through one division of the four divisions spout out into the storage section 15*bb* through inflow openings 116*bb* formed respectively in the plurality of nozzles 161. Accordingly, in the present embodiment, pairs of the inflow openings are formed diagonally at the side surfaces of each storage section. Further, since the inflow pipe 160 takes the structure that the interior is divided into four divisions, it is also possible to individually control the flow rates of cooling liquids flowing in the respective divisions. That is, the temperatures of the respective divisions may be monitored at all times by a controller (not shown), and another flow regulating valve (not shown) may be provided for each division at a suitable position on a path from a bottom opening referred to later to the inflow opening, the flow regulating valve being for regulating the flow rate passing through the inflow openings of the plurality of nozzles 161 upon receipt of an input signal that is transmitted from the controller in dependence on the temperature variation within the storage section. Thus, it is possible individually for each storage section to control the flow rates of the cooling liquids from the paired inflow openings being in the orthogonal direction. Incidentally, the inflow pipes 160 are formed at lower ends with bottom openings 118*aa*, 118*ab*, 118*ac*, 118*ad*, 118*ae*, 118*ba*, 118*bb*, 118*bc*, 118*bd*, 118*be*, 118*ca*, 118*cb*, 118*cc*, 118*cd*, 118*ce*, 118*da*, 118*db*, 118*dc*, 118*dd*, 118*de*, 118*ea*, 118*eb*, 118*ec*, 118*ed*, 118*ee* (hereafter, occasionally referred to as "bottom openings 118*aa* to 118*ee*" collectively). Each of the bottom openings 118*aa* to 118*ee* may be divided into four divisions respectively corresponding to the four division of the interior of each inflow pipe 160. Further, the upper end of each inflow pipe 160 is completely closed.

In the present embodiment, as shown in FIGS. 22 and 23, it is preferable to form the upper end of the outflow pipes 170 with outflow openings 17*bc*, 17*cb* without forming the outflow pipes 170 with the small holes. Incidentally, that these outflow openings become the outflow openings common to the plurality of storage sections is the same as the outflow openings in the embodiment shown in FIGS. 7 to 9.

In the present embodiment, the cooling efficiency can be further improved because the electronic apparatus 100 can be forcedly cooled by the plural flows of the cooling liquid 11 going from the plurality of the inflow openings 116*bb* toward the three processors 112, 110, 112 mounted on the surface 121*a* of the processor board 121, the inflow openings 116*bb* being formed as pairs in the orthogonal direction at the side surfaces of the storage section 15*bb* and being in the depth direction. The positions and number of the inflow pipes and the outflow pipes provided in each storage section are discretionary, and the inflow pipe and the outflow pipe may, of course, each be provided to be one or plural in the vicinity of the positions where the plural inner partitioning walls defining each storage section intersect with one another. It is essential for this embodiment to allow part of the cooled cooling liquid 11 flowing in the storage section 15*bb* to pass through the flow channel 123 as the gap between the back surface 121*b* of the processor board 121 and the surface 122*a* of the board 122.

Next, a cooling system according to still another embodiment will be described with reference to FIG. 24. In this embodiment, the configuration having the inflow pipes 160 piercing through the bottom wall 12*a* and extending to the vicinity of the liquid level 19 is the same as the configuration of the embodiment shown in FIGS. 22 and 23. However, a feature resides in that the inflow pipe 160 and the outflow pipe 170 are configured as a double pipe 180 containing the outflow pipe 170 in the inflow pipe 160, in other words, in that the double pipe 180 is configured having the outflow pipe 170 as an inner pipe and the inflow pipe 160 as an outer pipe. Incidentally, it is the same as the configurations in the embodiment shown in FIGS. 22 and 23 that the plurality of nozzles 161 are provided on the inflow pipe 160 in the longitudinal direction of the inflow pips 160 and are formed respectively with the inflow openings 116*aa* to 116*ee*, that the upper end of the inflow pipe 160 is completely closed, and that the inflow pipe 160 takes the configuration of the interior divided into four divisions wherein the cooling liquid 11 flowing along one of the four divisions is enabled to pass through the inflow openings 116*aa* to 116*ee* formed respectively on the plurality of nozzles 161 and then to spout out into the storage sections 15*aa* to 15*dd*.

In the present embodiment, the double pipe 180 may be arranged at the position where the plural inner partitioning walls defining the respective storage sections 15*aa* to 15*dd* intersect with one another, or in the vicinity of the position. That is, the double pipes 180 may be arranged to reside respectively at the intersection point of the inner partitioning wall 13*b* and the inner partitioning wall 14*b*, at the intersection point of the inner partitioning wall 13*b* and the inner partitioning wall 14*c*, at the intersection point of the inner partitioning wall 13*c* and the inner partitioning wall 14*b* and at the intersection point of the inner partitioning wall 13*c* and the inner partitioning wall 14*c*. Incidentally, the double pipe is not required to be integrated with the inner partitioning walls and may be the pipe which is arranged apart from the inner partitioning walls.

Accordingly, in the present embodiment, the inflow openings are formed at the four corners of the side surfaces of each storage section. Further, since the inflow pipe 160 is configured to have the interior divided into four divisions, it is also possible to individually control the flow rates of the cooling liquids flowing along the respective divisions. That is, the temperatures of the respective storage sections may be monitored at all times by a controller (not shown), and other flow regulating valves (not shown) may be provided for the respective divisions at suitable positions on the path from the bottom opening to the inflow opening, the other flow regulating valves being for regulating the flow rates of the cooling liquids passing through the inflow openings of the plurality of nozzles 161 upon receipt of an input signal that is transmitted from the controller in dependence on the temperature variation within the storage section. Thus, the flow rates of the cooling liquids from the inflow openings at the four corners on the side surfaces of each storage section can be controlled individually for each storage section. Incidentally, the lower ends of the inflow pipes 160 being the outer pipes of the double pipes 180 are formed with the bottom openings 118*aa* to 118*ee*. Each of the bottom openings 118*aa* to 118*ee* may be divided into four to correspond respectively to the four sections in the interior of the inflow pipe 160. Further, the upper end of the inflow pipe 160 being the outer pipe of the double pipe 180 is closed completely. Incidentally, the lower ends of the outflow pipes 170 are formed with the bottom openings 18aa to 18ee. That the outflow opening formed at the upper end of the inflow pipe 170 being the inner pipe of the double pipe 180 becomes the outflow opening common to the plurality of storage sections is the same as the outflow opening in the embodiment shown in FIGS. 22 and 23.

In the present embodiment, the cooling efficiency can be further improved because the electronic apparatus 100 can be forcedly cooled by the plural flows of the cooling liquids 11 going from the plurality of the inflow openings 116bb, which are formed at the four corners of the side surfaces of the storage section 15bb to be in the depth direction, toward the three processor 112, 110, 112 mounted on the surface 121a of the processor board 121. Incidentally, the positions and number of the double pipes provided in each storage section are discretionary, and one or plural double pipes may, of course, be provided in the vicinity of the positions where the plurality of inner partitioning walls defining each storage section intersect with one another. It is essential for this embodiment to allow part of the cooled cooling liquid 11 flowing in the storage section 15bb to pass through the flow channel 123 as the gap between the back surface 121b of the processor board 121 and the surface 122a of the board 122.

Figure 24:
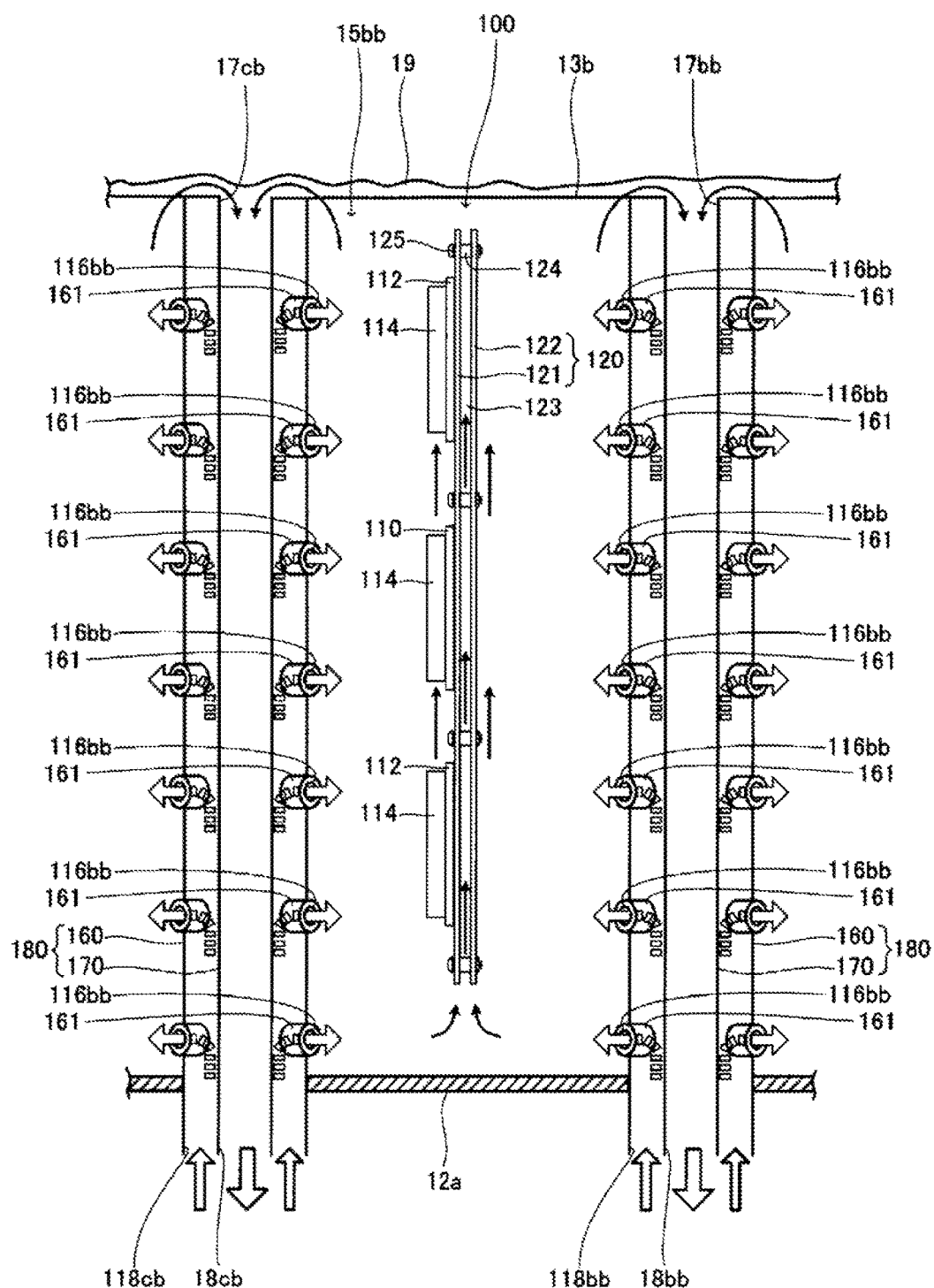
FIG. 24 is a longitudinal sectional view representing structure of an essential part of the cooling system according to another embodiment of the present invention.

In the foregoing embodiments of cooling system shown in FIGS. 22 and 23 and the foregoing embodiment of cooling system shown in FIG. 24, as examples of the inflow openings formed on the side surfaces of each storage section, description has been made regarding the example of pairs formed in the orthogonal direction of each storage section and the example of those formed at the four corners of each storage section. Further, in order to form the inflow openings on the side surfaces of each storage section, configurations are taken to utilize the inflow pipe having the plurality of nozzles formed with the inflow openings and to arrange the inflow pipe at the position where the plurality of inner partitioning walls defining each storage section intersect with one another, or in the vicinity of the position. However, these do not constitute limitations in the configuration that the inflow openings are formed on the side surfaces of each storage section. For example, as another example of the configuration, inner partitioning walls each taking a hollow structure may be used in place of arranging the inflow pipes, one or more slits may be formed on the wall surfaces of the inner partitioning walls to form inflow openings, and cooled cooling liquid may be made to flow in the inner partitioning walls and to spout out into the storage sections through the one or more slits. Further, as still another example of the configuration, branches which cooled cooling liquid passes through may be provided on a part or all of the surfaces of the inner partitioning walls, and the inflow openings may be formed at arbitrary positions of the branches by an arbitrary number, so that the cooling liquid may spout out into the storages section through these inflow openings.

Although in the foregoing one embodiment and other embodiments, illustration has been made regarding the example in which the single processor (CPU) 110 and two processors (GPU) 112 are mounted on the surface 121a of the processor board 121 of the electronic apparatus 100, there may be included a high speed memory, a chip set, a network unit, a PCI express bus, a bus switching unit, an SSD, and power units (ac-dc converter, dc-dc voltage converter and the like). Further, the electronic apparatus 100 may be an electronic apparatus such as a server including a blade server, a network device such as a router and a network switch, and a storage device such as an SSD and a hermetic HDD (Hard Disk Drive). However, as mentioned already, the electronic apparatus 100 may, of course, be an electronic apparatus of a smaller width (for example, about ½, ⅓ or ¼) than that of those conventional in the prior art.

In short, as described hereinabove, according to the cooling system of the present invention, the electronic devices being smaller in width than those in the prior art are stored in the storage sections of the volume being about ¼ or being smaller than about ¼ of the volume of the open space in the cooling tank, and the cooling liquid is made to pass through the individuals of the storage sections, whereby the plurality of electronic apparatuses can be individually cooled at high efficiency. Thus, it can be avoided that, as is true with the prior art, differences in cooling efficiency arise in dependence on the storage positions of electronic apparatuses within a cooling tank. Accordingly the performance in cooling of the plurality of electronic apparatuses can be improved and stabilized. Further, since it is possible to reduce the size of the electronic apparatuses stored in the storage sections, the capability of being handled and the maintainability of the electronic apparatuses can be improved. Furthermore, the present invention is capable of improving the cooling efficiency by immersion cooling of the electronic apparatus.

INDUSTRIAL APPLICABILITY

The present invention is widely applicable to cooling electronic apparatuses that require ultra-high performance operations and stable operations and that have large amounts of heat generated from themselves.

LIST OF REFERENCE SIGNS

10: cooling system
10a: open space
100: electronic apparatus
110: processor (CPU)
112: processor (GPU)
114: heat radiation member
120: multi-stage board
121: processor board (first board)
121a: surface (first surface)
121b: back surface (second surface)
122: board (second board)
122a: surface (third surface)
122b: surface
123: flow channel
124: spacer
125: screw
130, 131: connector
132, 132a, 132b: electric contact
133: conductive collar
134: conductive hole
140, 141, 141a, 141b: power source line
150: signal line
11: cooling liquid
12: cooling tank
12a: bottom wall
12b: side wall
13a, 13b, 13c, 13d, 13e: inner partitioning wall
14a, 14b, 14c, 14d, 14e: inner partitioning wall
15aa, 15ab, 15ac, 15ad, 15ba, 15bb, 15bc, 15bd, 15ca, 15cb, 15cc, 15cd, 15da, 15db, 15dc, 15dd: storage section 16: inlet
16aa, 16ab, 16ac, 16ad, 16ba, 16bb, 16bc, 16bd, 16ca, 16cb, 16cc, 16cd, 16da, 16db, 16dc, 16dd: inflow opening
116aa, 116ab, 116ac, 116ad, 116ae, 116ba, 116bb, 116bc, 116bd, 116be, 116ca, 116cb, 116cc, 116cd, 116ce, 116da, 116db, 116dc, 116dd, 116de, 116ea, 116eb, 116ec, 116ed, 116ee: inflow opening
160: inflow pipe
161: nozzle
17aa, 17ab, 17ac, 17ad, 17ae, 17ba, 17bb, 17bc, 17bd, 17be, 17ca, 17cb, 17cc, 17cd, 17ce, 17da, 17db, 17dc, 17dd, 17de, 17ea, 17eb, 17ec, 17ed, 17ee: outflow opening
170: outflow pipe
171: small hole
18: outlet
180: double pipe
18aa, 18ab, 18ac, 18ad, 18ae, 18ba, 18bb, 18bc, 18bd, 18be, 18ca, 18cb, 18cc, 18cd, 18ce, 18da, 18db, 18dc, 18dd, 18de, 18ea, 18eb, 18ec, 18ed, 18ee: bottom opening
118aa, 118ab, 118ac, 118ad, 118ae, 118ba, 118bb, 118bc, 118bd, 118be, 118ca, 118cb, 118cc, 118cd, 118ce, 118da, 118db, 118dc, 118dd, 118de, 118ea, 118eb, 118ec, 118ed, 118ee: bottom opening
19: liquid level,
20a, 20b, 20c, 20d: board retainer
30: flow passage
40: pump
50: flow rate regulating valve
70: flowmeter,
90: heat exchanger

The invention claimed is:

1. An electronic apparatus which is directly cooled through immersion in a cooling liquid filled in a cooling system, in which:
the electronic apparatus is stored in each of a plurality of arrayed storage sections of the cooling system;
the cooling system includes a cooling tank having an open space defined by a bottom wall and side walls, the plurality of storage sections defined by dividing the open space with a plurality of inner partitioning walls arranged in the cooling tank, and an inflow opening and an outflow opening for the cooling liquid that are formed at each of the plurality of arrayed storage sections;
the inflow opening is formed in a bottom portion or a side surface of the storage sections, and the outflow opening is formed in a vicinity of the liquid level of the cooling liquid which circulates through a respective one of the storage sections;
the electronic apparatus comprising:
a first board having a first surface on which at least one processor is mounted, and a second surface opposite the first surface;
a second board having a third surface that faces the second surface of the first board;
a flow channel formed as a gap between the second surface of the first board and the third surface of the second board; and
a plurality of spacers and a plurality of screws for retaining the gap, wherein each of the screws penetrates through the first board, the second board, and the spacers for fixation,
wherein:
the first board or the second board includes at least one connector,
the connector is electrically coupled with a power source line or a signal line provided for a pair of board retainers which retain any one or both of the first board and the second board in the respective one of the storage sections.

2. The electronic apparatus according to claim 1, wherein:
the plurality of screws comprises one or more conductive screws;
the first board includes a first electric contact, and the second board includes a second electric contact; and
the first electric contact of the first board is electrically coupled with the second electric contact of the second board via a corresponding one of the one or more conductive screws; wherein any one or both of the first electric contact of the first board and the electric contact of the second board is electrically coupled with the power source line or the signal line provided for the pair of board retainers which retain any one or both of the first board and the second board in the respective one of the storage sections.

3. The electronic apparatus according to claim 2, wherein a conductive hole through which the corresponding one of the one or more conductive screws penetrates is formed in a corresponding one of the spacers.

4. The electronic apparatus according to claim 1, wherein:
the plurality of screws comprises one or more conductive screws;
the plurality of spacers comprises one or more conductive spacers;
the first board includes a first electric contact, and the second board includes a second electric contact; and
the first electric contact of the first board is electrically coupled with the second electric contact of the second board via a corresponding one of the one or more conductive screws and a corresponding one of the one or more conductive spacers; wherein any one or both of the first electric contact of the first board and the second electric contact of the second board is electrically coupled with the power source line or the signal line provided for the pair of board retainers which retain any one or both of the first board and the second board in the respective one of the storage sections.

5. The electronic apparatus according to claim 1, wherein:
the first board includes a first electric contact, and the second board includes a second electric contact; and
the first electric contact of the first board is electrically coupled with the second electric contact of the second board via a conductive hole formed in a corresponding one of the spacers, through which a corresponding one of the screws penetrates; wherein any one or both of the first electric contact of the first board and the second electric contact of the second board is electrically coupled with the power source line or the signal line provided for the pair of board retainers which retain any one or both of the first board and the second board in the respective one of the storage sections.

6. The electronic apparatus according to claim 1, wherein:
the plurality of spacers comprises one or more conductive spacers;
the first board includes a first electric contact, and the second board includes a second electric contact; and
the first electric contact of the first board is electrically coupled with the second electric contact of the second board via a corresponding one of the one or more conductive spacers; wherein any one or both of the first electric contact of the first board and the second electric contact of the second board is electrically coupled with the power source line or the signal line provided for a pair of board retainers which retain any one or both of the first board and the second board in the respective one of the storage sections.

7. A cooling system configured to immerse a plurality of electronic apparatuses in a cooling liquid for direct cooling, comprising:
a cooling tank having an open space formed by a bottom wall and side walls;
a plurality of arranged storage sections formed by dividing the open space with a plurality of inner partitioning walls disposed in the cooling tank;
an inflow opening and an outflow opening for the cooling liquid that are formed at each of the plurality of storage sections; and
a pair of board retainers provided for a respective one of the storage sections, wherein: the inflow opening is formed in a bottom portion or a side surface of each of the storage sections, and the outflow opening is formed in an area near a liquid level of the cooling liquid which circulates through the respective one of the storage sections;
the pair of board retainers are configured to retain any one or both of a first board and a second board of the electronic apparatus;
each of the electronic apparatuses includes the first board having a first surface on which at least one processor is mounted, and a second surface opposite the first surface, the second board having a third surface which faces the second surface of the first board, and a flow channel formed as a gap between the second surface of the first board and the third surface of the second board; and
a plurality of spacers and a plurality of screws for retaining the gap, wherein each of the screws penetrates through the first board, the second board, and the spacers for fixation,
wherein:
the first board or the second board includes at least one connector,
the connector is electrically coupled with a power source line or a signal line provided for a pair of board retainers which retain any one or both of the first board and the second board in the respective one of the storage sections.

8. The cooling system according to claim 7, wherein the outflow opening and/or the inflow opening is formed at a position where the plurality of inner partitioning walls defining each of the storage sections intersect with one another, or in a vicinity of the position.

9. The cooling system according to claim 7, further comprising an outflow pipe piercing through the bottom wall and extending to a vicinity of the liquid level, wherein the outflow opening is formed at one end of the outflow pipe.

10. The cooling system according to claim 9, wherein one or more small holes are formed in a longitudinal direction of the outflow pipe.

11. The cooling system according to claim 7, further comprising an inflow pipe piercing through the bottom wall and extending to a vicinity of the liquid level,
wherein the inflow pipe has a plurality of nozzles in a longitudinal direction of the inflow pipe and wherein the inflow opening is formed on each of the plurality of nozzles.

12. The cooling system according to claim 7, further comprising an inflow pipe and an outflow pipe that pierce through the bottom wall and that extend to a vicinity of the liquid level; wherein:
the inflow pipe is provided with a plurality of nozzles in a longitudinal direction of the inflow pipe, and the inflow opening is formed on each of the plurality of nozzles;
the outflow opening is formed at an upper end of the output pipe; and
the inflow pipe and the outflow pipe are alternately arranged at positions where the plurality of inner partitioning walls defining each of the storage sections intersect with one another, or in a vicinity of the positions.

13. The cooling system according to claim 7, further comprising an inflow pipe and an output pipe that pierce through the bottom wall and that extend to a vicinity of the liquid level; wherein:
the inflow pipe is provided with a plurality of nozzles in a longitudinal direction of the inflow pipe, and the inflow opening is formed on each of the plurality of nozzles;
the outflow opening is formed at an upper end of the outflow pipe; and
the inflow pipe and the outflow pipe constitute a double pipe containing the outflow pipe in the inflow pipe.

14. The cooling system according to claim 13, wherein the double pipe is arranged at a position where the plurality of inner partitioning walls defining each of the storage sections intersect with one another, or in a vicinity of the position.

15. The cooling system according to claim 7, wherein the cooling liquid contains perfluoride as a main component.

16. The cooling system according to claim 7, wherein the inflow opening includes a plurality of inflow openings,
the outflow opening includes a plurality of outflow openings,
the cooling tank has an inlet for distributing the cooling liquid toward the inflow openings of respective ones of the storage sections, and
an outlet for collecting the cooling liquid passing through the outflow openings of the respective ones of the storage sections; and wherein:
the outlet and the inlet are connected through a flow passage existing outside the cooling tank; and
at least one pump for moving the cooling liquid and a heat exchanger for cooling the cooling liquid are provided in the flow passage.

17. The cooling system according to claim 16, further comprising a mechanism which, in response to an input signal depending on the temperature variation in each of the storage sections, regulates a flow rate of the cooling liquid passing through the inflow opening of each of the storage sections or a flow rate of the cooling liquid passing through each nozzle provided on the inflow pipe.

18. The cooling system according to claim 7, further comprising a temperature sensor for the cooling liquid provided in each of the storage sections and a mechanism which discontinues an operation of a corresponding one of the electronic apparatuses stored in the respective one of the storage sections or interrupts a power supply to the corresponding one of the electronic apparatuses when a predetermined temperature or higher is detected by the temperature sensor.

19. The cooling system according to claim 7, further comprising a temperature sensor provided in each of the electronic apparatuses stored in the respective one of the storage sections, or in a surrounding area of each of the electronic apparatuses stored in the respective one of the storage sections and a mechanism which discontinues an operation of a corresponding one of the electronic apparatuses or interrupts a power supply to the corresponding one of the electronic apparatuses when a predetermined temperature or higher is detected by the temperature sensor.

20. The cooling system according to claim 7, wherein the pair of board retainers include the power source line or the signal line electrically coupled with any one or both of the first board and the second board.

* * * * *